(12) United States Patent
Peri et al.

(10) Patent No.: US 9,698,152 B2
(45) Date of Patent: Jul. 4, 2017

(54) THREE-DIMENSIONAL MEMORY STRUCTURE WITH MULTI-COMPONENT CONTACT VIA STRUCTURE AND METHOD OF MAKING THEREOF

(71) Applicant: SANDISK TECHNOLOGIES INC., Plano, TX (US)

(72) Inventors: Somesh Peri, San Jose, CA (US); Sateesh Koka, Milpitas, CA (US); Raghuveer S. Makala, Campbell, CA (US); Rahul Sharangpani, Fremont, CA (US); Matthias Baenninger, Menlo Park, CA (US); Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/926,347

(22) Filed: Oct. 29, 2015

(65) Prior Publication Data
US 2016/0141294 A1    May 19, 2016

Related U.S. Application Data

(63) Continuation-in-part of application No. 14/540,479, filed on Nov. 13, 2014, now Pat. No. 9,419,135,
(Continued)

(51) Int. Cl.
*H01L 27/11* (2006.01)
*H01L 27/1157* (2017.01)
(Continued)

(52) U.S. Cl.
CPC .... *H01L 27/1157* (2013.01); *H01L 21/28512* (2013.01); *H01L 21/28562* (2013.01);
(Continued)

(58) Field of Classification Search
CPC ........... H01L 27/1157; H01L 27/11582; H01L 21/28512; H01L 21/28562;
(Continued)

(56) References Cited

U.S. PATENT DOCUMENTS 5,084,417 A    1/1992    Joshi et al.
5,807,788 A    9/1998    Brodsky et al.
(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Armando Rodriguez
(74) *Attorney, Agent, or Firm* — The Marbury Law Group PLLC

(57) ABSTRACT

A contact via structure can include a ruthenium portion formed by selective deposition of ruthenium on a semiconductor surface at the bottom of a contact trench. The ruthenium-containing portion can reduce contact resistance at the interface with an underlying doped semiconductor region. At least one conductive material portion can be formed in the remaining volume of the contact trench to form a contact via structure. Alternatively or additionally, a contact via structure can include a tensile stress-generating portion and a conductive material portion. In case the contact via structure is formed through an alternating stack of insulating layers and electrically conductive layers that include a compressive stress-generating material, the tensile stress-generating portion can at least partially cancel the
(Continued)

compressive stress generated by the electrically conductive layers. The conductive material portion of the contact via structure can include a metallic material or a doped semiconductor material.

13 Claims, 26 Drawing Sheets

Related U.S. Application Data which is a continuation-in-part of application No. 14/703,367, filed on May 4, 2015.

(51) Int. Cl.
  H01L 27/11582 (2017.01)
  H01L 29/66 (2006.01)
  H01L 21/285 (2006.01)
  H01L 21/768 (2006.01)
  H01L 29/78 (2006.01)
  H01L 23/532 (2006.01)

(52) U.S. Cl.
  CPC .. *H01L 21/28568* (2013.01); *H01L 21/76877* (2013.01); *H01L 27/11582* (2013.01); *H01L 29/66553* (2013.01); *H01L 23/53266* (2013.01); *H01L 29/78* (2013.01)

(58) Field of Classification Search
  CPC ......... H01L 21/28568; H01L 21/76877; H01L 23/53266; H01L 29/66553; H01L 29/78
  See application file for complete search history.

(56) References Cited

U.S. PATENT DOCUMENTS

| | | |
|---|---|---|
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,378,353 B2 | 5/2008 | Lee et al. |
| 7,514,321 B2 | 4/2009 | Mokhlesi et al. |
| 7,575,973 B2 | 8/2009 | Mokhlesi et al. |
| 7,608,195 B2 | 10/2009 | Wilson |
| 7,648,872 B2 | 1/2010 | Benson |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,445,347 B2 | 5/2013 | Alsmeier |
| 8,461,000 B2 | 6/2013 | Alsmeier et al. |
| 8,580,639 B2 | 11/2013 | Alsmeier et al. |
| 8,765,543 B2 | 7/2014 | Alsmeier et al. |
| 8,884,357 B2 | 11/2014 | Wang et al. |
| 8,987,087 B2 | 3/2015 | Chien et al. |
| 8,987,089 B1 | 3/2015 | Pachamuthu et al. |
| 9,023,719 B2 | 5/2015 | Pachamuthu et al. |
| 2002/0190379 A1 | 12/2002 | Jian et al. |
| 2006/0102586 A1 | 5/2006 | Lee et al. |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0256247 A1 | 10/2012 | Alsmeier |
| 2013/0122712 A1 | 5/2013 | Kim et al. |
| 2013/0126957 A1 | 5/2013 | Higashitani et al. |
| 2013/0224960 A1 | 8/2013 | Payyapilly et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0225181 A1 | 8/2014 | Makala et al. |
| 2015/0008505 A1 | 1/2015 | Chien et al. |
| 2015/0076584 A1 | 3/2015 | Pachamuthu et al. |
| 2015/0076585 A1 | 3/2015 | Pachamuthu et al. |
| 2015/0079742 A1 | 3/2015 | Pachamuthu et al. |
| 2015/0179660 A1 | 6/2015 | Yada et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," • Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

(56) References Cited

OTHER PUBLICATIONS

M. Claes et al., "Selective Wet Etching of Hf-based Layers," Abstracts, 204th Meeting of the Electrochemical Society, 2003.
Lim et al., "The Effect of CF4 Addition on Ru Etching with Inductively Coupled Plasma," Journal of the Korean Physical Society, vol. 42, Feb. 2003.
Lee et al., "Reactive Ion Etching Mechanism of $RuO_2$ Thin Films in Oxygen Plasma with the Addition of $CF_4$, $CL_2$, and $N_2$," Abstract from 1998 Jpn. J. Appl. Phys. 37 2634.
Yunogami et al., "Anisotropic Etching of $RuO_2$ and Ru with High Aspect Ratio for Gigabit Dynamic Random Access Memory," Abstract from J. Vac. Sci. Technol. B 18, 1911 (2000).
Elam et al., "Nucleation and Growth During Tungsten Atomic Layer Deposition on $SiO_2$ Surfaces," Thin Solid Films, 386 (2001) pp. 41-52.
Park et al., "Thermal and Plasma Enhanced Atomic Layer Deposition Ruthenium and Electrical Characterization as a Metal Electrode," Microelectronic Engineering 85 (2008) pp. 39-44.
Thompson et al., "Stress Evolution During and After Deposition of Polycrystalline Thin Films," Department of Materials Science and Engineeering, Massachusetts Institute of Technology.
R. Abermann, "Measurements of the Intrinsic Stress in Thin Metal Flims," Vacuum vol. 41, Nos. 4-6, pp. 1279-1282, 1990.
U.S. Appl. No. 14/314,370, filed Jun. 25, 2014, SanDisk Technologies Inc.
U.S. Appl. No. 14/319,591, filed Jun. 30, 2014, SanDisk Technologies Inc.
U.S. Appl. No. 14/462,209, filed Aug. 18, 2014, SanDisk Technologies Inc.
U.S. Appl. No. 14/464,480, filed Aug. 20, 2014, SanDisk Technologies Inc.
U.S. Appl. No. 14/468,743, filed Aug. 26, 2014, SanDisk Technologies Inc.
U.S. Appl. No. 14/491,026, filed Sep. 19, 2014, SanDisk Technologies Inc.
U.S. Appl. No. 14/491,315, filed Sep. 19, 2014, SanDisk Technologies Inc.
U.S. Appl. No. 14/501,539, filed Sep. 30, 2014, SanDisk Technologies Inc.
U.S. Appl. No. 14/540,479, filed Nov. 13, 2014, SanDisk Technologies Inc.
U.S. Appl. No. 14/553,124, filed Nov. 25, 2014, SanDisk Technologies Inc.
U.S. Appl. No. 14/553,149, filed Nov. 25, 2014, SanDisk Technologies Inc.
U.S. Appl. No. 14/553,207, filed Nov. 25, 2014, SanDisk Technologies Inc.
U.S. Appl. No. 14/602,491, filed Jan. 22, 2015, SanDisk Technologies Inc.
U.S. Appl. No. 14/699,749, filed Apr. 29, 2015, SanDisk Technologies Inc.
U.S. Appl. No. 14/703,367, filed May 4, 2015, SanDisk Technologies Inc.
U.S. Appl. No. 14/723,919, filed May 28, 2015, SanDisk Technologies Inc.
U.S. Appl. No. 14/840,474, filed Aug. 31, 2015, SanDisk Technologies Inc.

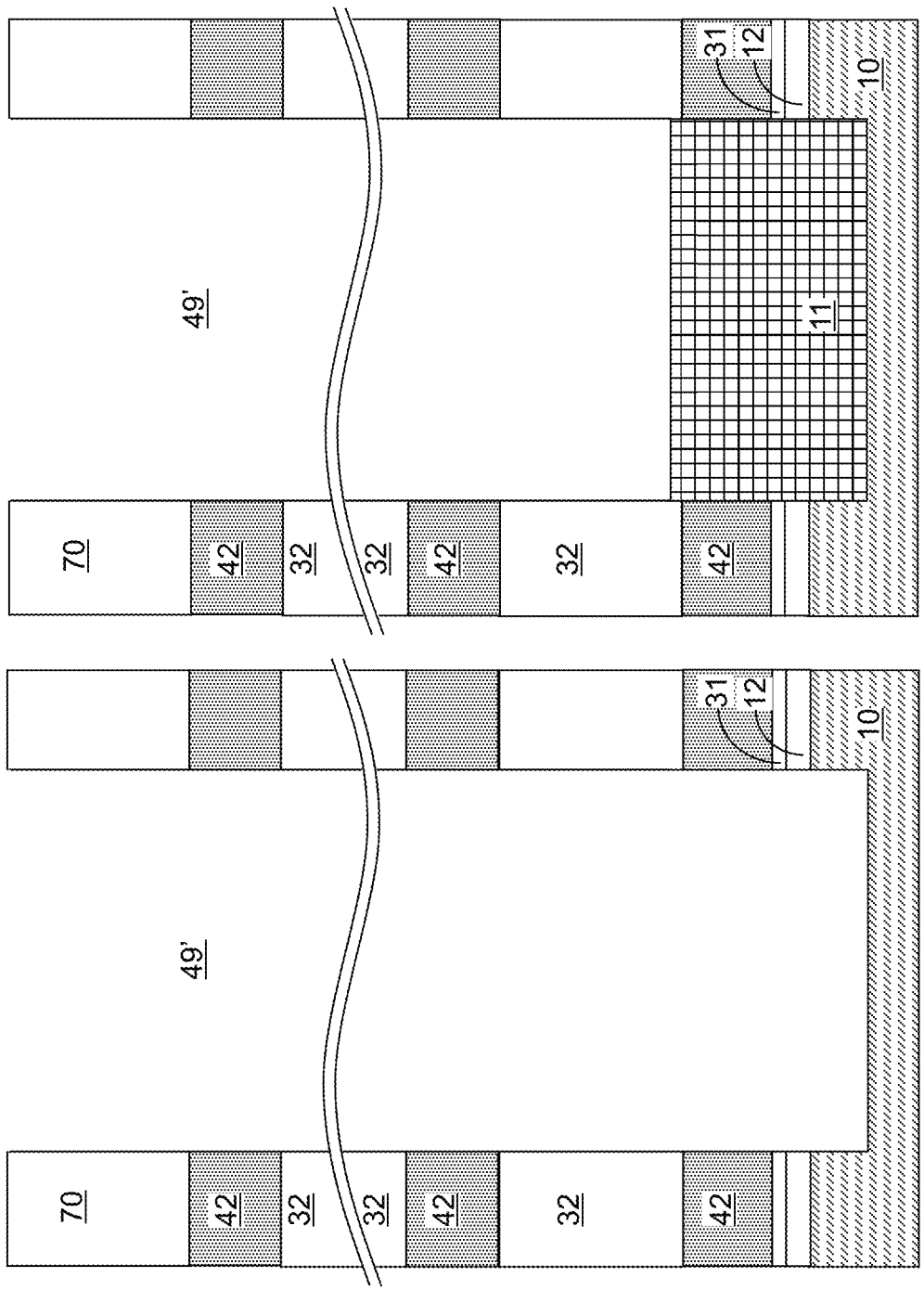

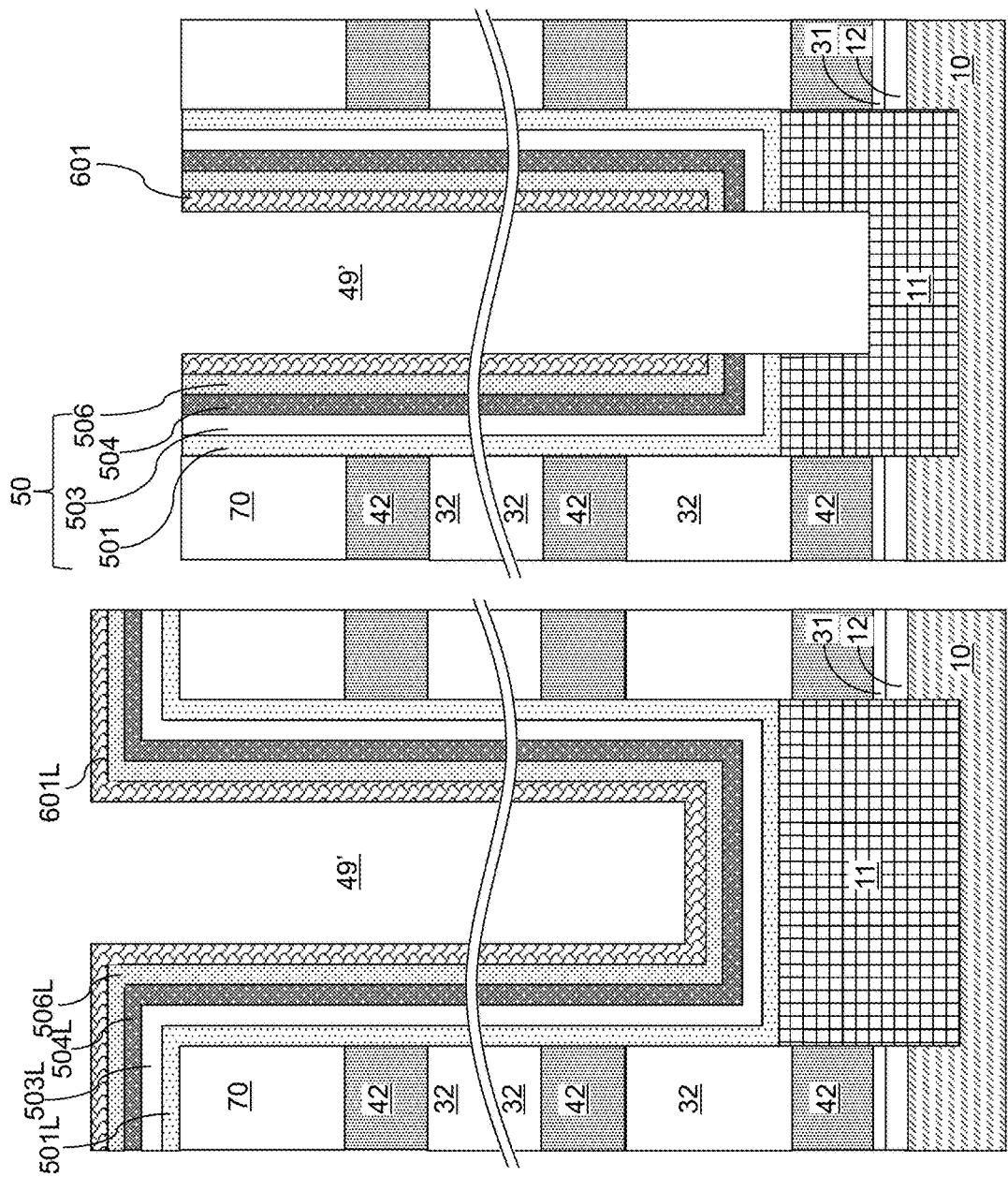

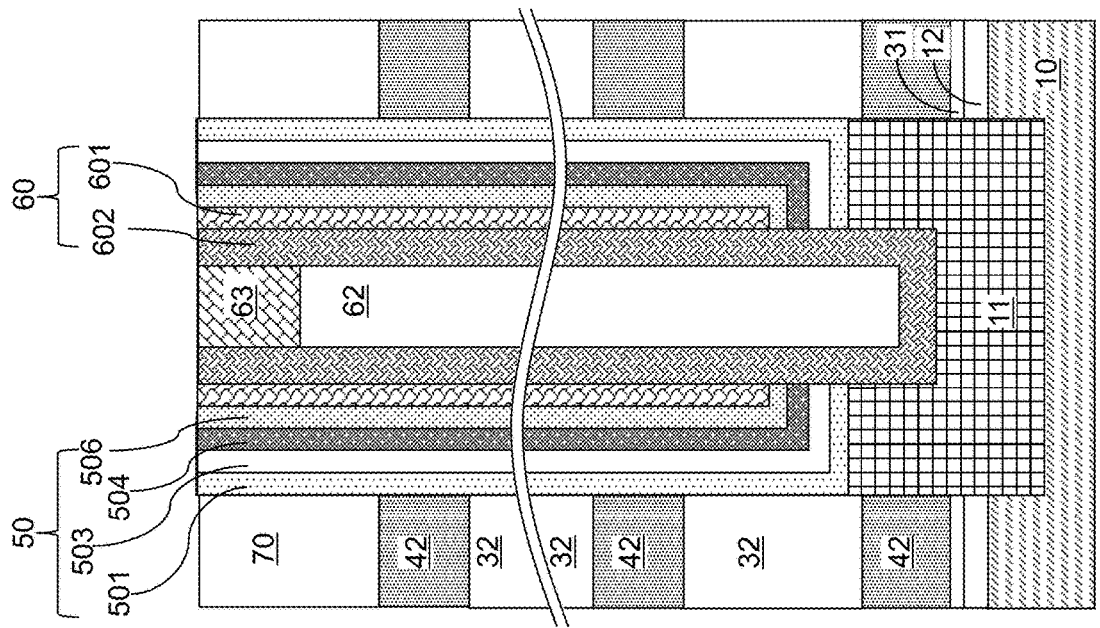
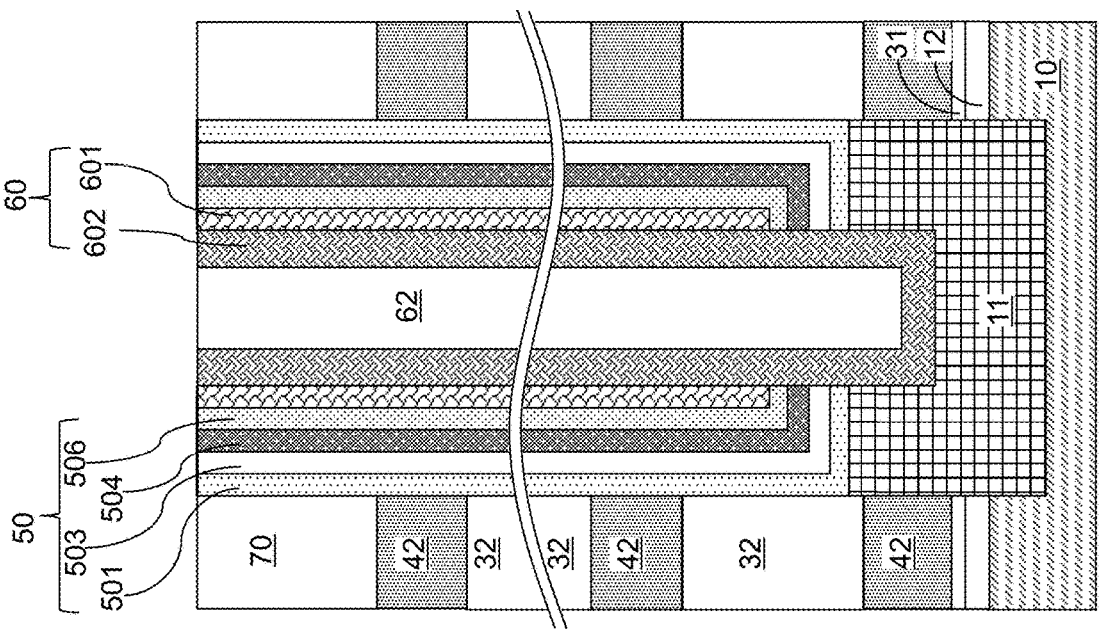

THREE-DIMENSIONAL MEMORY STRUCTURE WITH MULTI-COMPONENT CONTACT VIA STRUCTURE AND METHOD OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36. A three-dimensional NAND memory structure includes an alternating stack of insulating layers and electrically conductive layers. Contact via structures extend through such an alternating stack to contact an active region.

SUMMARY

According to an aspect of the present disclosure, a structure is provided, which comprises an alternating stack of insulating layers and electrically conductive layers located over a substrate; an insulating spacer located at a periphery of a contact trench that extends through the alternating stack; and a contact via structure laterally surrounded by the insulating spacer and comprising a ruthenium-containing portion contacting a top surface of a doped semiconductor portion in or over the substrate, and at least one conductive material portion overlying the ruthenium-containing portion and located within an inner sidewall of the insulating spacer.

According to another aspect of the present disclosure, a structure is provided, which comprises: an alternating stack of insulating layers and electrically conductive layers located over a substrate; an insulating spacer located at a periphery of a contact trench that extends through the alternating stack; and a contact via structure laterally surrounded by the insulating spacer. The contact via structure comprises: a metallic diffusion barrier layer contacting a top surface of a doped semiconductor portion in or over the substrate and an inner sidewall of the insulating spacer; a tensile stress-generating metal portion surrounded by the metallic diffusion barrier layer; and a conductive material portion contacting the tensile stress-generating metal portion and surrounded by the metallic diffusion barrier layer.

According to yet another aspect of the present disclosure, a method of manufacturing a structure is provided. An alternating stack comprising insulating layers and electrically conductive layers is formed over a substrate having a trench extending through the alternating stack. An insulating spacer is formed on a sidewall of the trench. A ruthenium-containing portion is formed on a top surface of a doped semiconductor portion in or over the substrate and underlying the trench. At least one conductive material portion is formed on the ruthenium-containing portion within an unfilled volume of the trench. A combination of the ruthenium-containing portion and the at least one conductive material portion constitutes a contact via structure.

According to still another aspect of the present disclosure, a method of manufacturing a structure is provided. An alternating stack comprising insulating layers and electrically conductive layers is formed over a substrate having a trench extending through the alternating stack. An insulating spacer is formed on a sidewall of the trench. A contact via structure is formed by forming a metallic diffusion barrier layer on a top surface of a doped semiconductor portion located in or over the substrate and on an inner sidewall of the insulating spacer and forming a combination of a tensile stress-generating metal portion and a conductive material portion on the metallic diffusion barrier layer in an unfilled volume of the trench.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

DETAILED DESCRIPTION

Figure 1:
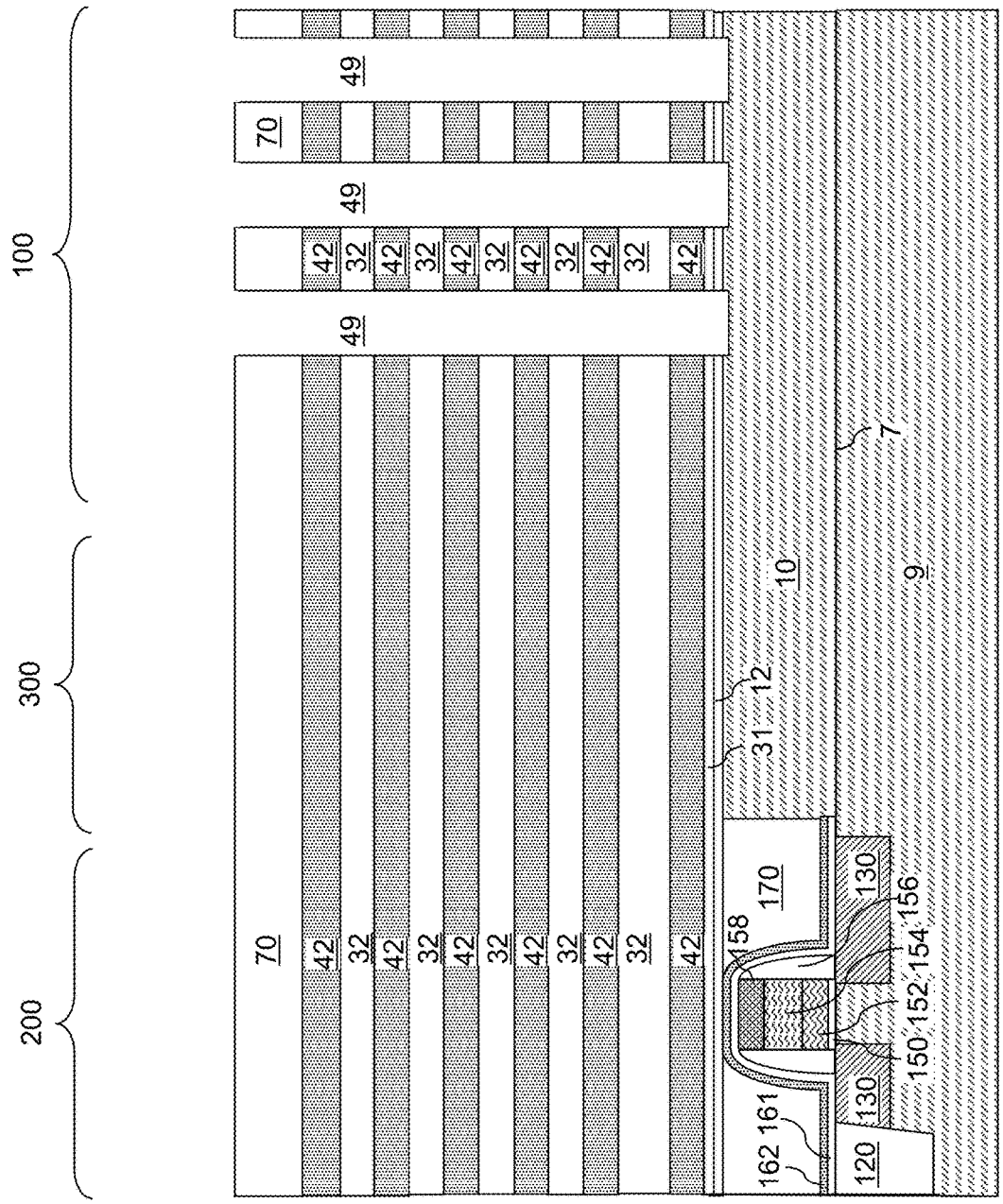
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which may include a semiconductor substrate (e.g., a single crystalline silicon wafer). The substrate can include a substrate semiconductor layer 9 including a top surface 7, which is herein referred to as a major surface of the substrate (as opposed to a minor surface having a lesser area such as a sidewall surface of the substrate semiconductor layer 9), and a semiconductor well layer 10. The substrate semiconductor layer 9 and the semiconductor well layer 10 may comprise semiconductor material layers, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor well layer 10 can include at least one doped well (not expressly shown) having a substantially uniform dopant concentration therein.

The first exemplary structure can have multiple regions for building different types of devices. Such areas can include, for example, a device region 100, a contact region 300, and a peripheral device region 200. At least one semiconductor device for a peripheral circuitry can be formed on a portion of the substrate semiconductor layer 9. The at least one semiconductor device can include, for example, field effect transistors that are formed in the peripheral device region 200. Optionally, a portion of the substrate semiconductor layer 9 in the peripheral device region may be recessed by a masked recess etch, or may be raised by a selective epitaxy process that employs a dielectric hard mask that covers other regions, prior to formation of the at least one semiconductor device therein.

Optionally, shallow trench isolation structures 120 may be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor well layer 10 can be formed on the top surface of the substrate semiconductor layer 9 by deposition of a single crystalline semiconductor material, for example, by selective epitaxy. Alternatively, the optional semiconductor well layer 10 may be formed by implantation of electrical dopants (p-type dopants or n-type dopants) into at least one upper portion of the substrate semiconductor layer 9. In case the optional semiconductor well layer 10 is not formed, the substrate semiconductor layer 9 can extend to the top surface of the substrate. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor well layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor well layer 10 can have a top surface that is coplanar with the top surface of the planarization dielectric layer 170.

In one embodiment, the semiconductor well layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Optionally, a gate dielectric layer 12 can be formed above the semiconductor well layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer, which is a material layer that provides vertical spacing between a neighboring pair of insulating layers 32. In one embodiment, each first material layer can be an insulating layer 32, and each second material layer can be a sacrificial material layer 42. In other words, the spacer material layers may be sacrificial material layers 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. Alternatively, the spacer material layers may be formed as electrically conductive layers. In this case, replacement of the spacer material layers with different electrically conductive layers in a subsequent processing step may not be necessary.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, silicon oxynitride, and a dielectric metal oxide.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor well layer 10. The recess depth of the bottom surface of each memory opening 49 with respect to the top surface of the semiconductor well layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor well layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor well layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer (501L, 503L), a continuous memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504L, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the tunneling dielectric layer 506L, the continuous memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504L, and the at least one blocking dielectric layer (SOIL, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the at least one blocking dielectric layer (SOIL, 503L) at a bottom of each cavity 49' can be removed to form openings in remaining portions thereof. Each of the first semiconductor channel layer 601L, the tunneling dielectric layer 506L, the continuous memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer SOIL is herein referred to as a first blocking dielectric 501.

A surface of the epitaxial channel portion 11 (or a surface of the semiconductor well layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor well layer 10 in case epitaxial channel portions 11 are not employed) by a recess distance. A tunneling dielectric 506 is located over the memory material layer 504.

A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2E:
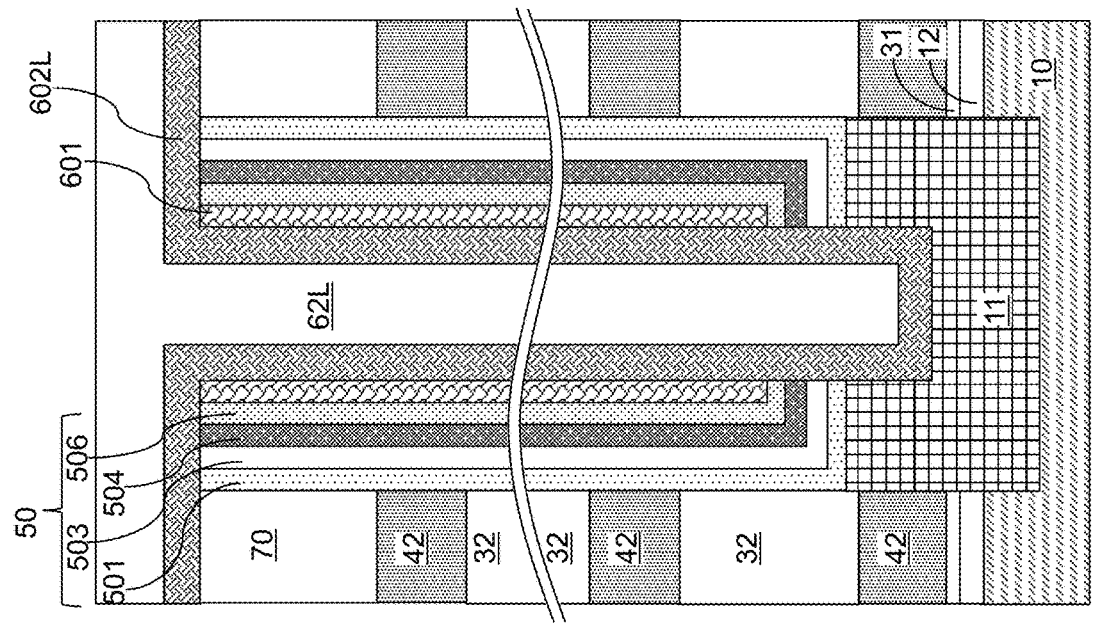

Referring to FIG. 2E, a second semiconductor channel layer 602L can be deposited directly on the semiconductor surface of the epitaxial channel portion 11 or the semiconductor well layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2F:
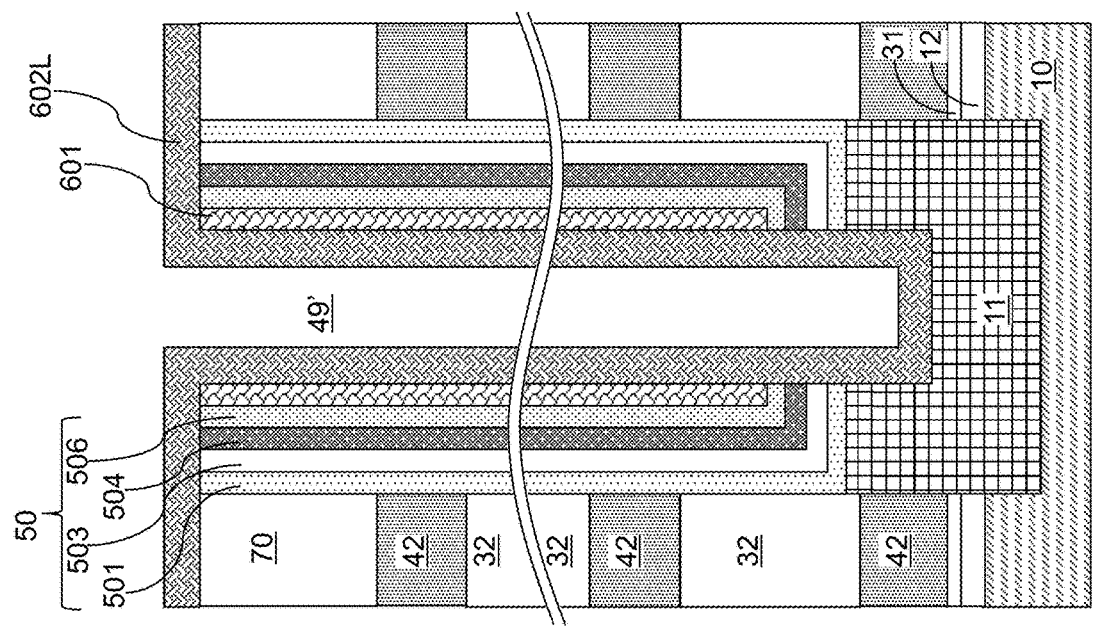

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
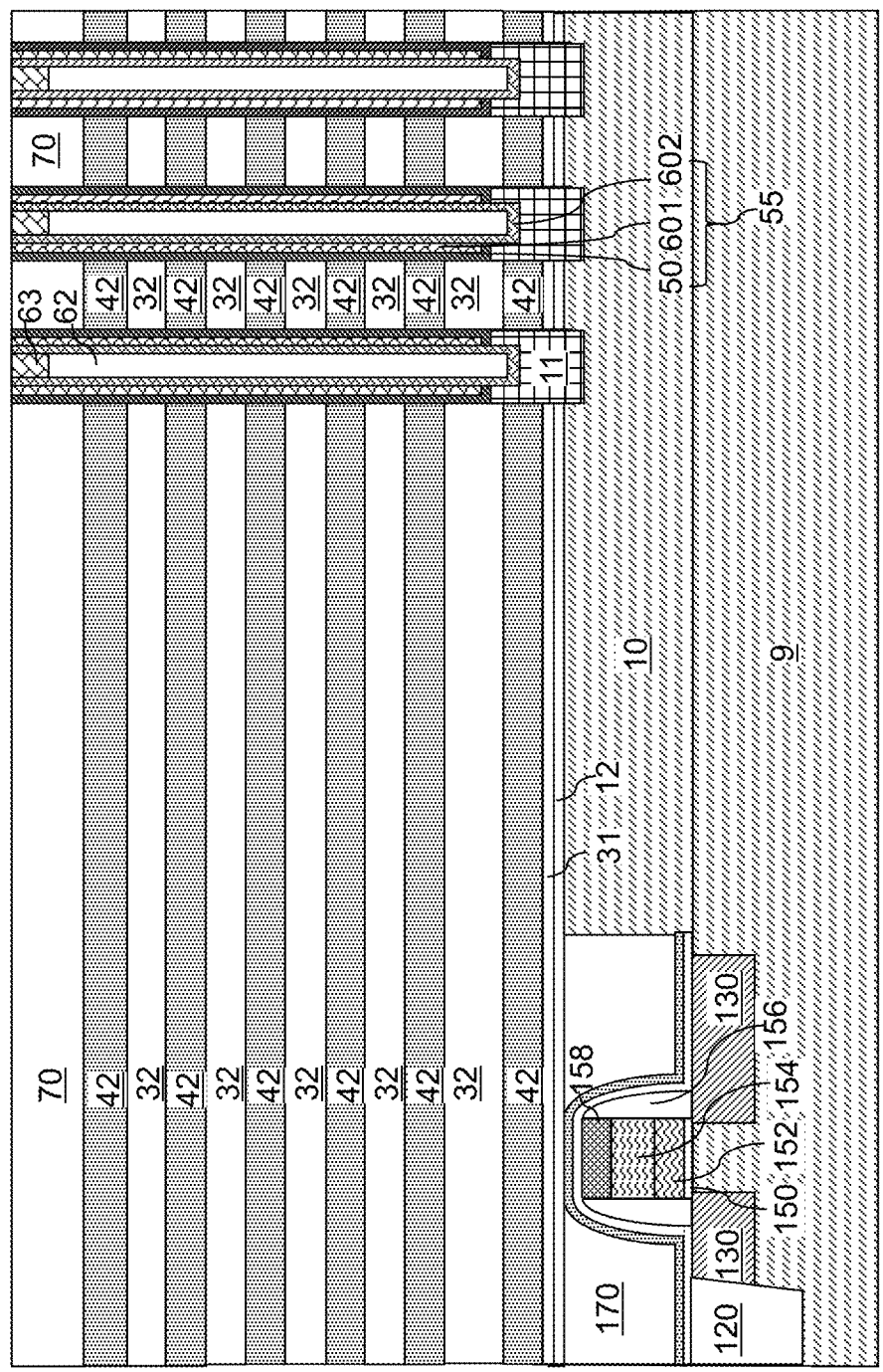
FIG. 3 is a vertical cross-sectional view of the first exemplary structure after formation of memory stack structures according to the first embodiment of the present disclosure.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2H. Each exemplary memory stack structure 55 includes a semiconductor channel 60 (comprising layers 601, 602); a tunneling dielectric layer 506 laterally surrounding the semiconductor channel 60; and a vertical stack of charge storage regions laterally surrounding the tunneling dielectric layer 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor well layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures.

Figure 4:
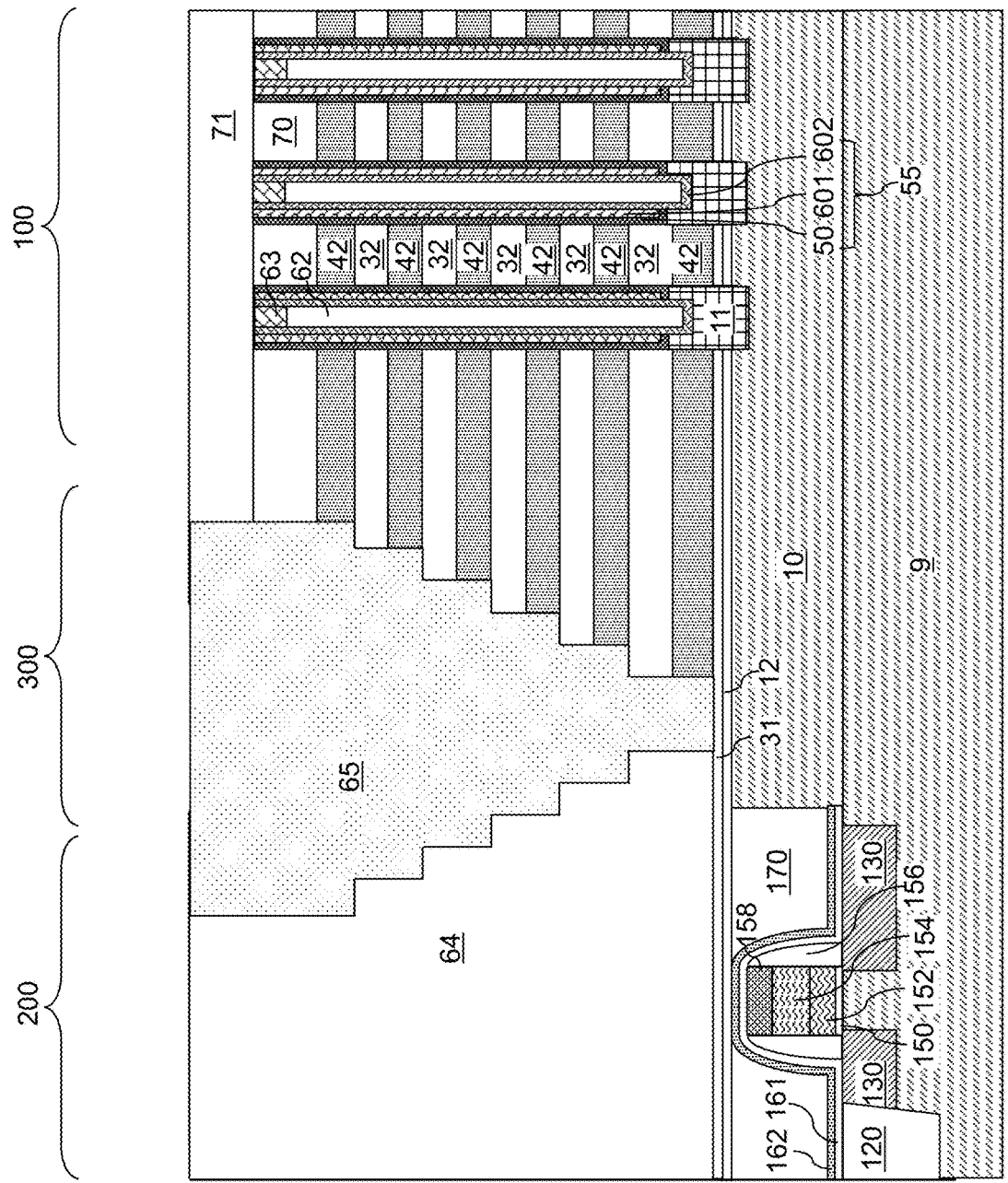
FIG. 4 is a vertical cross-sectional view of the first exemplary structure after formation of a set of stepped surfaces and a retro-stepped dielectric material portion according to the first embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5A:
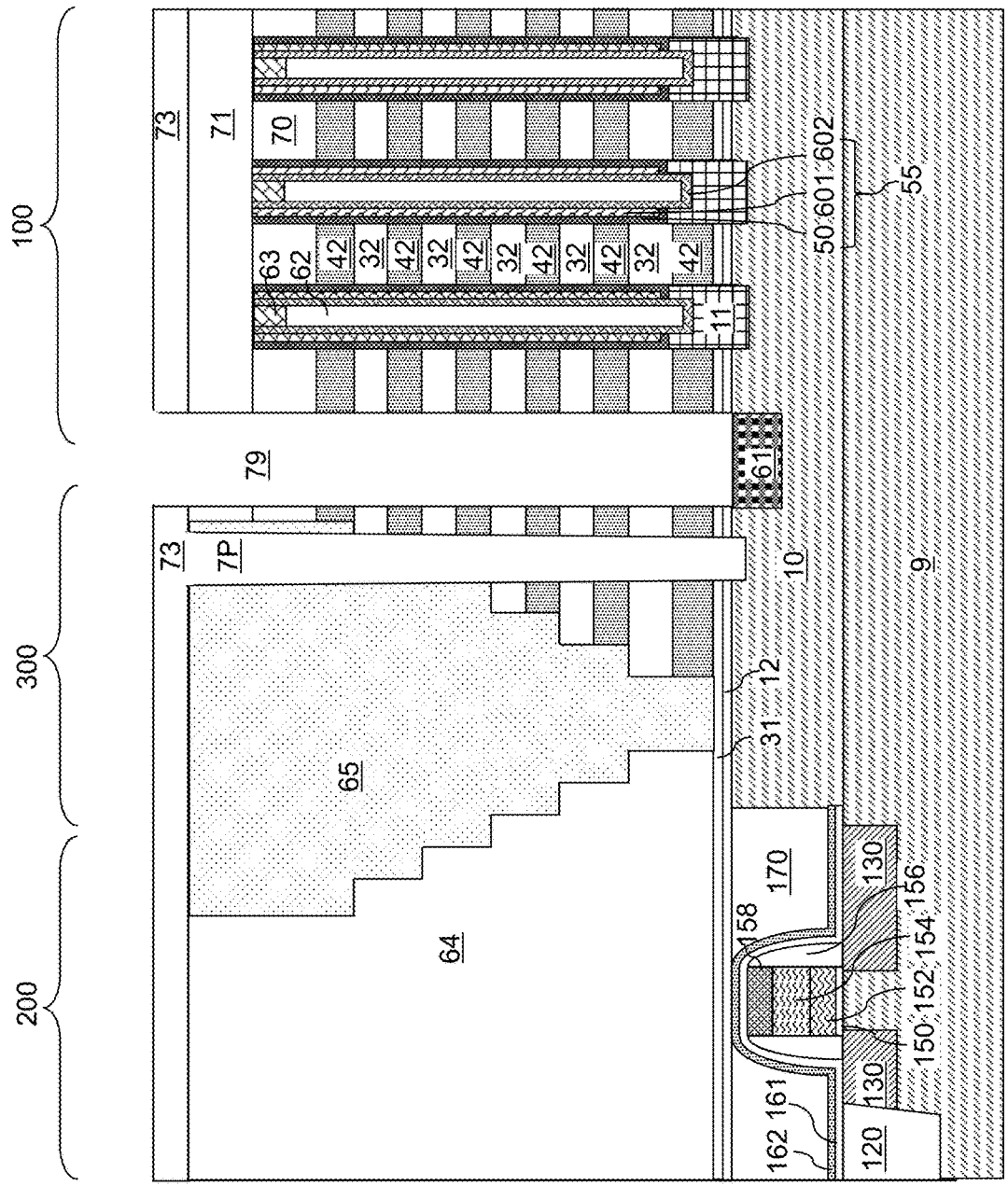
FIG. 5A is a vertical cross-sectional view of the first exemplary structure after formation of dielectric pillar structures and formation of backside trenches according to the first embodiment of the present disclosure.
Figure 5B:
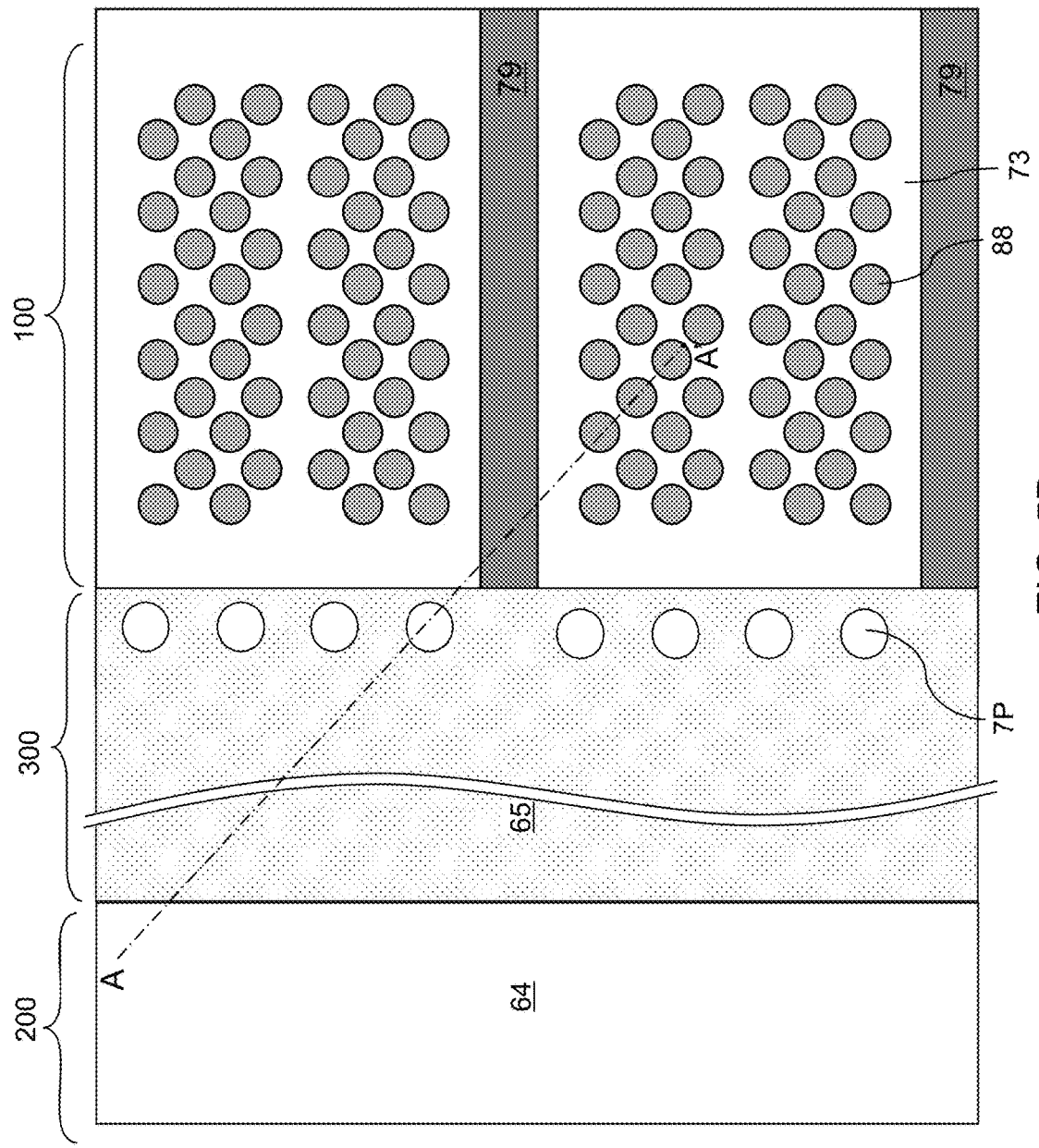
FIG. 5B is a see-through top-down view of the first exemplary structure of FIG. 5A. The vertical plane A-A' is the plane of the vertical cross-sectional view of FIG. 5A.

Referring to FIGS. 5A and 5B, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Trenches (which are herein referred to as backside trenches 79) can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). Each backside trench 79 extends through the in-process alternating stack (32, 42) and to the top surface of the substrate (9, 10). A top surface of the semiconductor substrate layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

The alternating stack of insulating layers 32 and the sacrificial material layers 42 is an in-process structure, i.e., an in-process alternating stack. The in-process alternating stack is subsequently modified by replacement of the sacrificial material layers 42 with electrically conductive layers.

Figure 6:
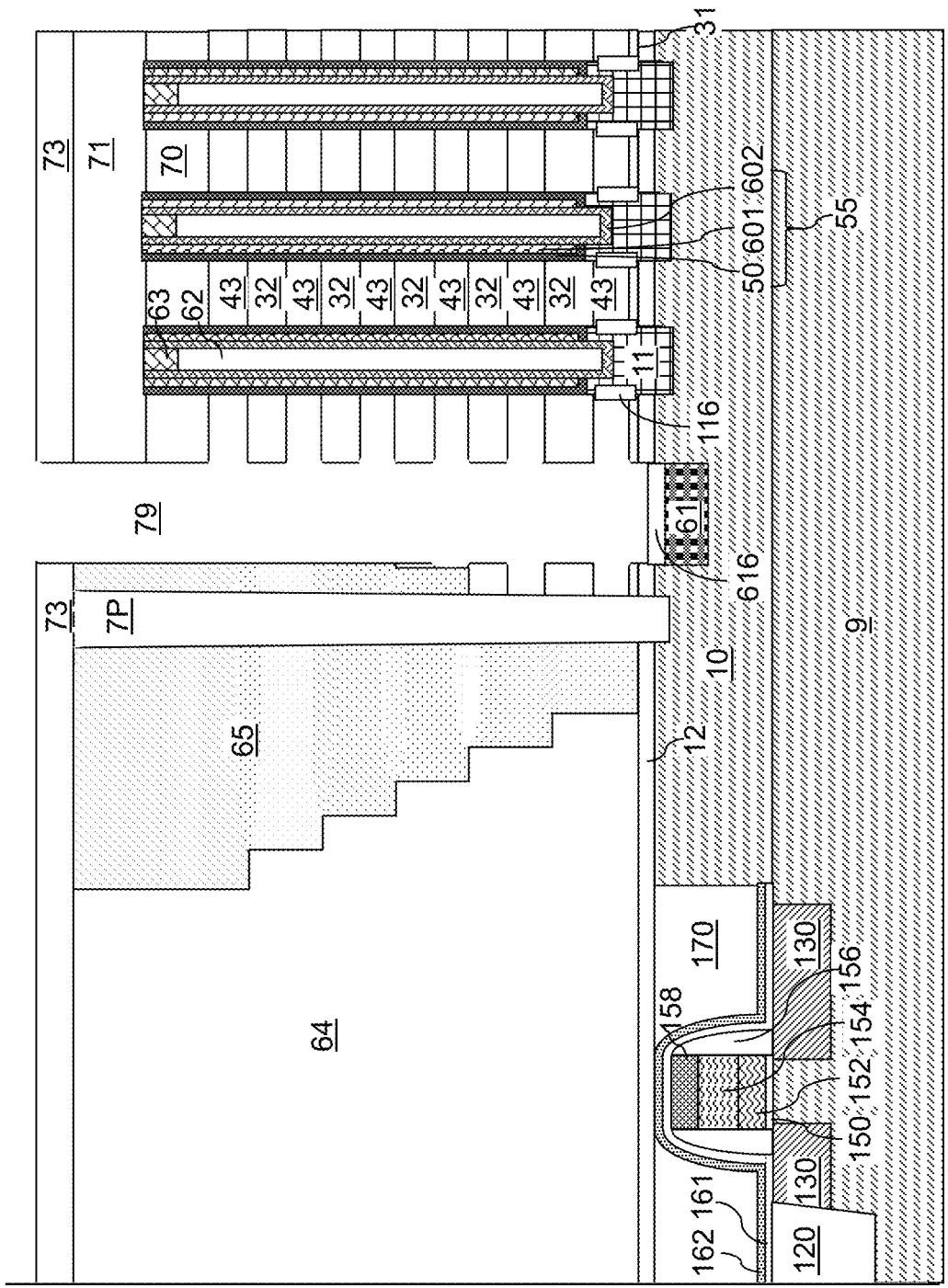
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced through the backside trenches 79, for example, employing an etch process. Recesses (which are herein referred to as backside recesses 43) are formed in volumes from which the sacrificial material layers 42 are removed. The backside trenches 79 and the backside recesses 43 are formed from locations away from the memory stack structures 55, which are formed within memory openings 49 that are also referred to as front side openings.

The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 7:
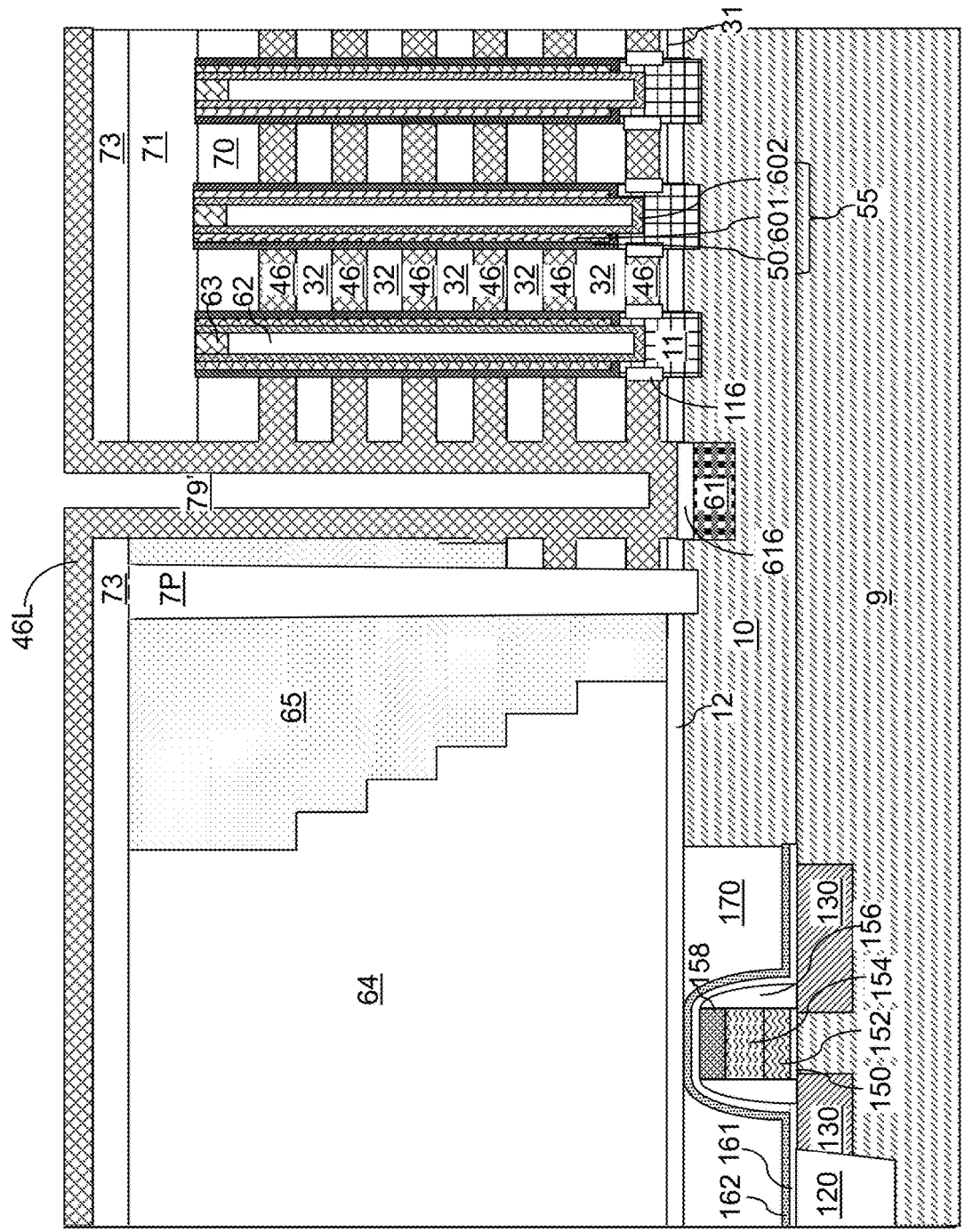
FIG. 7 is a vertical cross-sectional view of the first exemplary structure after formation of electrically conductive layers according to the first embodiment of the present disclosure.

Referring to FIG. 7, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas can comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L.

Figure 8:
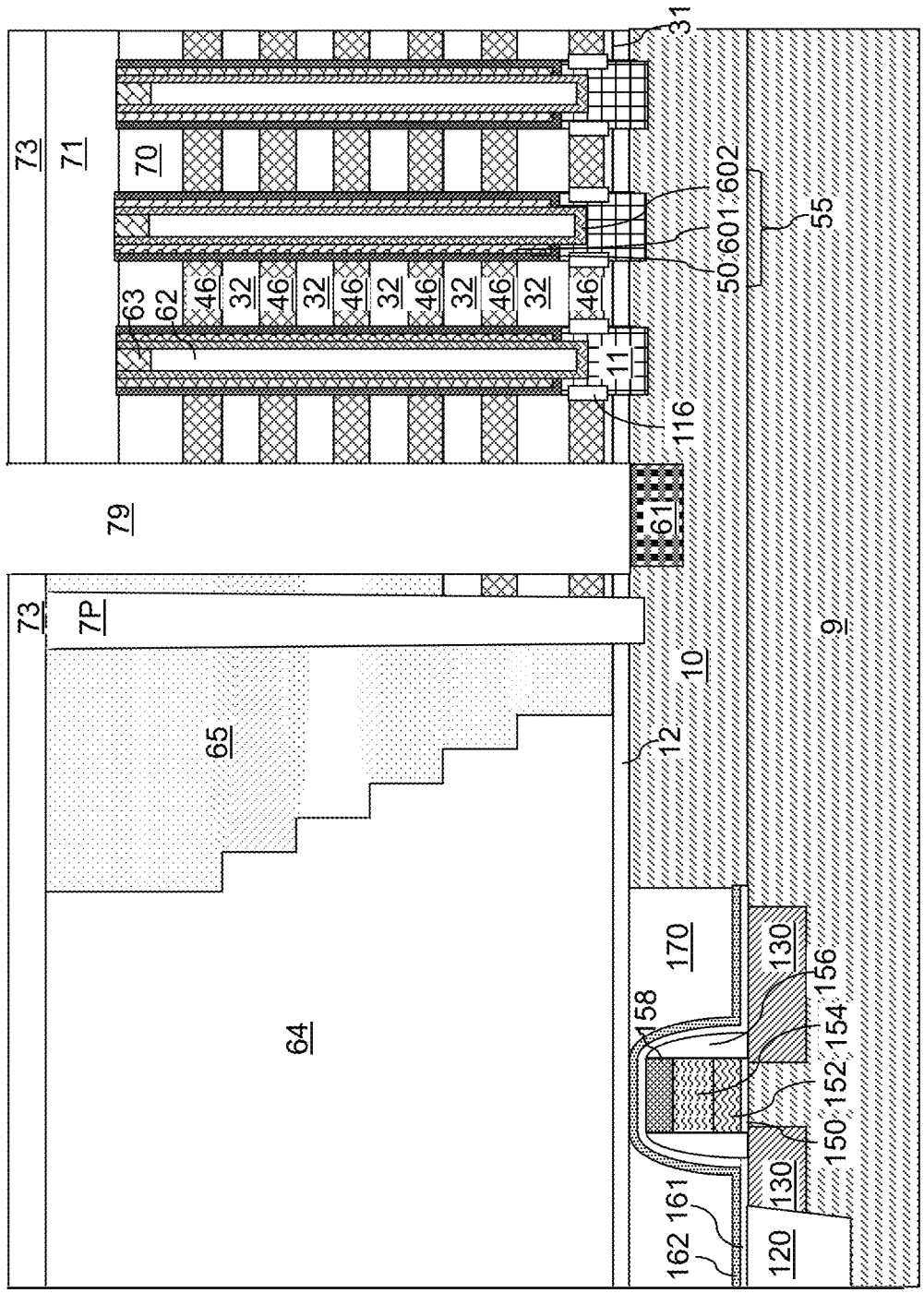
FIG. 8 is a vertical cross-sectional view of the first exemplary structure after removal of a deposited conductive material from within the backside contact trench according to the first embodiment of the present disclosure.

Referring to FIG. 8, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate (9, 10).

Figure 9:
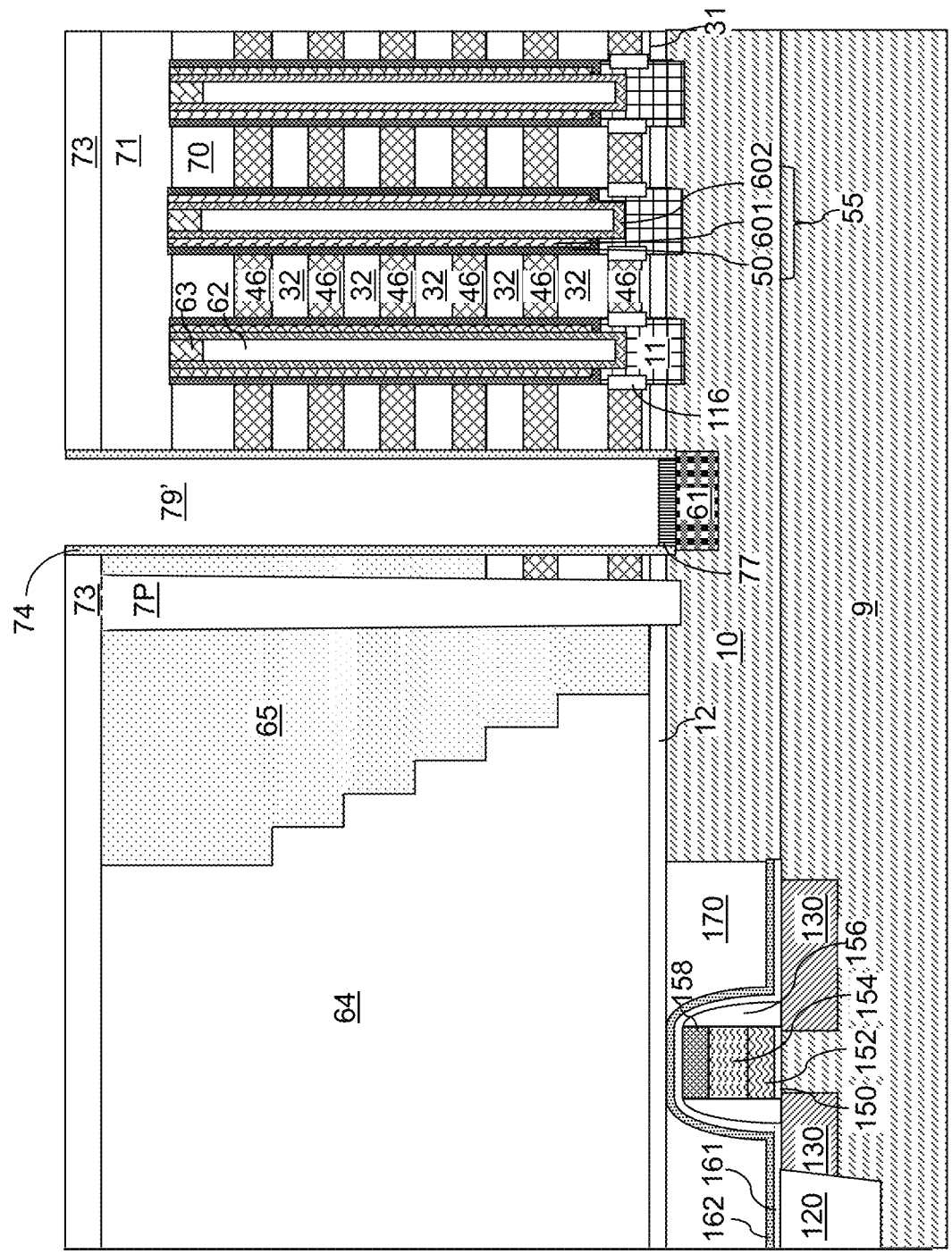
FIG. 9 is a vertical cross-sectional view of the first exemplary structure after formation of an insulating spacer and a ruthenium-containing portion according to the first embodiment of the present disclosure.

Referring to FIG. 9, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46.

The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity 79'. A top surface of a source region 61 (which is a doped semiconductor material portion) can be physically exposed at the bottom of each backside cavity 79' that is provided within an insulating spacer 74.

A ruthenium-containing portion 77 can be formed on the top surface of each source region 61 (which is a doped semiconductor portion in or over (e.g., embedded in) the substrate (9, 10) underneath each backside cavity 79'). In one embodiment, the ruthenium-containing portions 77 can be formed by selective deposition of ruthenium on semiconductor surfaces while ruthenium is not deposited on dielectric surfaces such as the surfaces of the insulating spacers 74 and the second contact level dielectric layer 73. The ruthenium-containing portions 77 can consist essentially of ruthenium, or can include ruthenium as the predominant element (i.e., an element that accounts for more than 50 at. % of all atoms, such as 75-99 at %) and at least one additional metallic element.

In one embodiment, ruthenium-containing portions 77 can be deposited selectively only on physically exposed surfaces of the source regions 61 without growing from the surfaces of the insulating spacers 74 or the second contact level dielectric layer 73. Deposition of the ruthenium-containing portions 77 can be performed by atomic layer deposition (ALD) in which a volatile ruthenium precursor, such as $RuO_4$, is supplied into a reaction chamber in which the exemplary structure is placed. One or more $RuO_2$ monolayers may be formed using atomic layer deposition. The one or more $RuO_2$ monolayers may be exposed to a reducing atmosphere to fully reduce the deposited one or more $RuO_2$ monolayers to one or more Ru monolayers. The $RuO_2$ deposition and Ru reducing steps (i.e., 1 atomic layer deposition (ALD) cycle) may be repeated multiple times. A hydrogen based forming gas, such as 2%-5% (such as 4%) hydrogen and 95%-98% (such as 96%) nitrogen, may be supplied as the reducing atmosphere for the ruthenium. In one embodiment, the atomic layer deposition is performed by performing multiple cycles of a $RuO_2$ deposition step and a Ru reduction step. The thickness of the ruthenium-containing portions 77 can be proportional to the number of cycles of the $RuO_2$ deposition step and the Ru reduction step. Alternatively, a selective chemical vapor deposition process (such as a metal-organic chemical vapor deposition (MOCVD) process) can be employed to deposit ruthenium in lieu of an ALD process.

ALD is a surface sensitive deposition process, i.e., the film growth is strongly dependent on the substrate's surface characteristics. Semiconductor surfaces provide easy nucleation for ruthenium, and dielectric surfaces such as silicon oxide surfaces hinder nucleation of ruthenium. Empirically, it has been observed that less than 25 cycles of $RuO_2$ deposition steps and Ru reduction steps results in discontinuous islands of ruthenium on the surfaces of insulator materials, while continuous portions of ruthenium can be formed on hydrophilic surfaces such as silicon surfaces. The deposited ruthenium material forms the ruthenium-containing portions 77, each of which can be a continuous material portion extending over the entire area within the inner periphery of a respective insulating spacer 74.

With less than 25 cycles of the ALD process, ruthenium does not form any contiguous material portion on the surfaces of the insulating spacers 74 or the second contact level dielectric layer 73, and grows only from the physically exposed portion of the top surfaces of the source regions 61. The thickness of each ruthenium-containing portion 77 in contact with a top surface of a respective source region 61 can be in a range from 1 nm to 10 nm, although lesser and greater thicknesses can also be employed. The ruthenium-containing portions 77 can consist essentially of ruthenium. The impurity contents in the ruthenium-containing portions 77 can be determined by the impurity level of the reactant gas, i.e., in the $RuO_4$ gas, and can be less than 10 parts per million (p.p.m.) or less than 1 p.p.m. The thickness of the ruthenium-containing portions 77 can be uniform throughout the entirety of each ruthenium-containing portion 77, and can be in a range from 3 nm to 7 nm, although lesser and greater thicknesses can also be employed.

Figure 10:
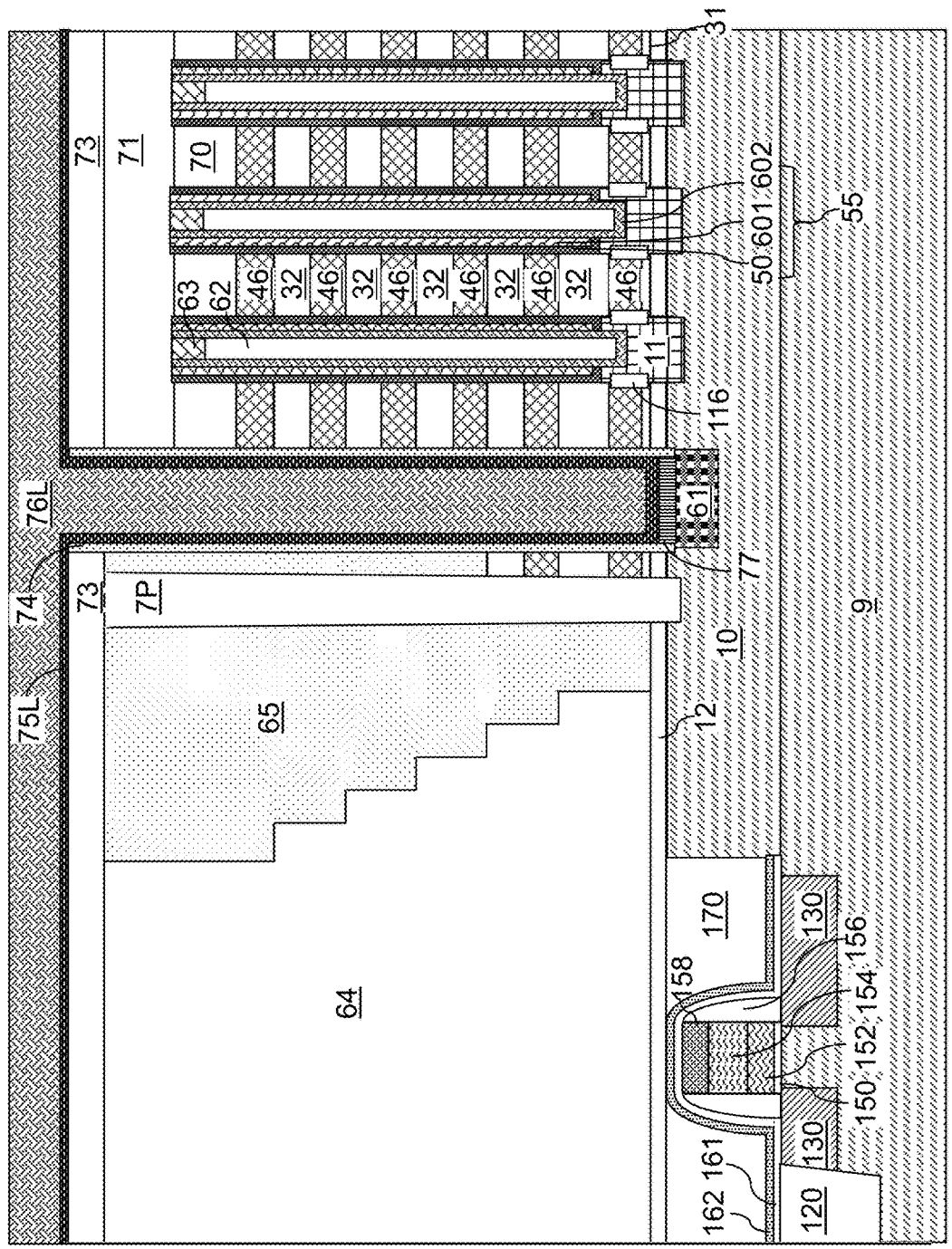
FIG. 10 is a vertical cross-sectional view of the first exemplary structure after deposition of a metallic diffusion barrier layer and a conductive fill material layer according to the first embodiment of the present disclosure.

Referring to FIG. 10, at least one conductive material layer can be deposited in each cavity in the backside trenches 79 and over the contact level dielectric layers (71, 73) employing one or more conformal deposition methods. The at least one conductive material layer can include, for example, a continuous metallic diffusion barrier layer 75L and a conductive fill material layer 76L.

The continuous metallic diffusion barrier layer 75L can include a metallic material that blocks diffusion of metals into the underlying semiconductor material (such as the semiconductor material of the source regions 61). For example, the continuous metallic diffusion barrier layer 75L can include a conductive metallic nitride such as TiN, TaN, and/or WN, and/or can include a conductive metallic carbide such as TiC, TaC, and/or WC. The thickness of the continuous metallic diffusion barrier layer 75L can be in a range from 2 nm to 20 nm, although lesser and greater thicknesses can also be employed.

The conductive fill material layer 76L can include an elemental metal or an intermetallic alloy of at least two metals. For example, the conductive fill material layer 76L can include W, Co, Ru, Al, Cu, or a combination or an alloy thereof. In one embodiment, the conductive fill material layer 76L can include a tensile stress-generating metallic material. As used herein, a "tensile stress-generating" element refers to an element that applies a tensile stress to a surrounding material and to the substrate, while being in compressive stress itself. As used herein, a "compressive stress-generating" element refers to an element that applies a compressive stress to a surrounding material and the substrate but is in tensile stress itself. Exemplary compressive stress-generating materials include tungsten while exemplary tensile stress generating materials include cobalt and ruthenium. In one embodiment, the electrically conductive layers 46 can be formed by depositing a compressive stress-generating material, such as tungsten, and the conductive fill material layer 76L can be formed by depositing a tensile stress-generating material, such as cobalt. In this case, the tensile stress-generating material in the backside trenches 79 can at least partially cancel the compressive stress generated by the compressive stress-generating material of the electrically conductive layers 46 (e.g., tungsten layers). The conductive fill material layer 76L can completely fill the cavities within the backside recesses 79.

In another embodiment, the conductive fill material layer 76L may comprise a fluorine free or low fluorine tungsten and the diffusion barrier layer 75 may comprise a fluorine free or low fluorine metal nitride, such as TiN or WN. As used herein, an element is fluorine free if the atomic concentration of fluorine in the elements is below trace level, i.e., below the level of atomic concentration of 0.01 p.p.m. In one embodiment, the deposition process can employ only fluorine-free materials for one or more reactants (precursor gases) and one or more additional optional agents (such as a nitridation agent or a reduction agent). The nitridation agent can be a nitrogen-containing gas such as nitrogen, nitrous oxide, nitric oxide, and/or ammonia. The nitridation agent can be a fluorine-free gas. The tungsten layer 76L can be formed employing at least one fluorine-free tungsten deposition process, i.e., at least one deposition process that deposits fluorine-free tungsten. In one embodiment, the deposition process can employ only fluorine-free materials for one or more reactants (precursor gases) and one or more additional optional agents (such as a reduction agent). The reduction agent can be a hydrogen-containing gas such as hydrogen, silane, diborane, or a combination thereof. The reduction agent can be a fluorine-free gas. In one embodiment, the fluorine-free tungsten deposition process of the tungsten layer 76L can be a chemical vapor deposition process or an atomic layer deposition process in which a fluorine-free tungsten precursor gas and a reduction agent gas are concurrently or alternately flowed into a process chamber in which the substrate is disposed. In one embodiment, the at least one fluorine-free tungsten deposition process comprises an atomic layer deposition process in which a fluorine-free tungsten precursor gas and a reduction gas are alternately flowed into a process chamber in which the substrate is disposed. In another embodiment, the at least one fluorine-free tungsten deposition process comprises a chemical vapor deposition process in which a fluorine-free tungsten precursor gas and a reduction gas are simultaneously flowed into a process chamber in which the substrate is disposed. In one embodiment, the fluorine-free tungsten precursor gas can be selected from tungsten chloride precursor gases and organometallic precursor gases including a tungsten atom. For example, the fluorine-free tungsten deposition process can be an atomic layer deposition process or a chemical vapor deposition process employing, as a fluorine-free metal precursor gas (i.e., a fluorine-free tungsten precursor gas), a gas selected from $WCl_6$, $W(CH_3)_6$, tungsten carbonyl, $WCl_2(Nt\text{-}Bu)_2py_2$, $W(Nt\text{-}Bu)_2Cl\{(Ni\text{—}Pr)_2CNi\text{—}Pr_2\}$, $W(Nt\text{-}Bu)_2Cl\{(Ni\text{—}Pr)_2CNMe_2\}$, $W(Nt\text{-}Bu)_2Cl\{(Ni\text{—}Pr)_2CNEt_2\}$, $W(Nt\text{-}Bu)_2Cl\{(NCy)_2CNEt_2\}$, $W(Nt\text{-}Bu)_2NMe_2\{(Ni\text{—}Pr)_2CNi\text{—}Pr_2\}$, $W(Nt\text{-}Bu)_2(NMe_2)\{(Ni\text{—}Pr)_2CNMe_2\}$, $W(Nt\text{-}Bu)_2(N_3)\{(Ni\text{—}Pr)_2CNi\text{—}Pr_2\}$, $W(Nt\text{-}Bu)_2\{(Ni\text{—}Pr)_2CNMe_2\}$, $[W(Nt\text{-}Bu)_2Cl\{NC(NMe_2)_2\}]_2$, $W(Nt\text{-}Bu)_2(N_3)\{NC(NMe_2)_2\}_2$, and $[(W(Nt\text{-}Bu)_2(N_3)(\mu_2\text{-}N_3)py)]_2$.

Figure 11:
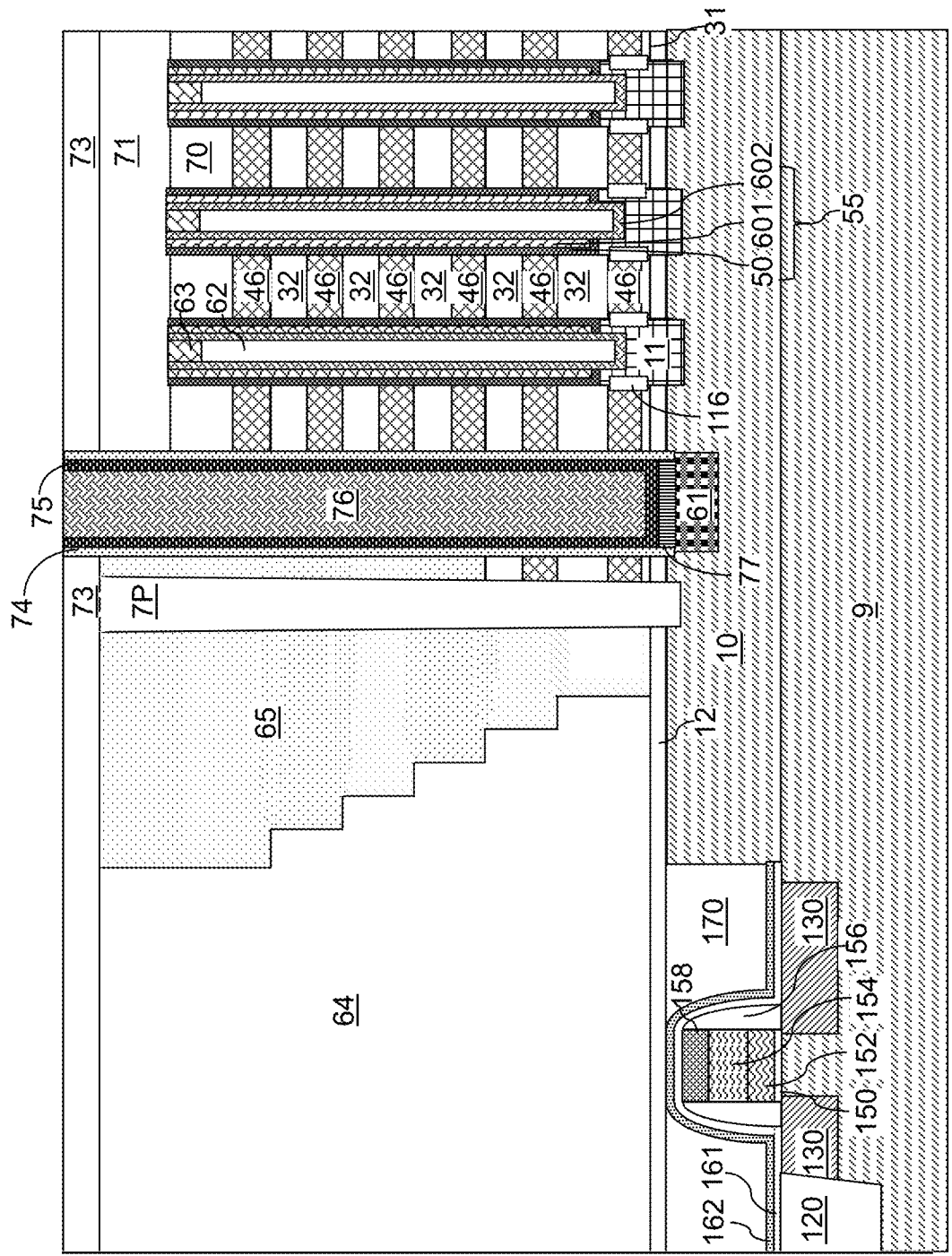
FIG. 11 is a vertical cross-sectional view of the first exemplary structure after a planarization process that forms a contact via structure according to the first embodiment of the present disclosure.

Referring to FIG. 11, excess portions of the conductive fill material layer 76L and the continuous metallic diffusion barrier layer 75L can be remove from above a horizontal plane including the top surface of the contact level dielectric layers (71, 73) by a planarization process. For example, a recess etch or chemical mechanical planarization can be employed for the planarization process. The top surface of the contact level dielectric layers (71, 73) can be employed as the stopping layer for the planarization process. Each remaining portion of the conductive fill material layer 76L constitutes a conductive fill material portion 76. Each remaining portion of the continuous metallic diffusion barrier layer 75L constitutes a metallic diffusion barrier portion 75. Each conductive fill material portion 76 can be surrounded by a metallic diffusion barrier layer 75. At least one conductive material portion (77, 75, 76) is formed directly on an inner sidewall of the insulating spacer 74. A combination of the ruthenium-containing portion 77 and the at least one conductive material portion (75, 76) can constitute a contact via structure (77, 75, 76). For example, each adjoining set including a ruthenium-containing portion 77, a metallic diffusion barrier portion 75, and a conductive fill material portion 76 within a contact trench can constitute a contact via structure (77, 75, 76). Each contact via structure (77, 75, 76) can be a source contact via structure that contacts a respective source region 61. The ruthenium-containing portion 77 lowers the contact resistivity of the contact via structure to the source region 61. Furthermore, since the ruthenium-containing portion 77 is preferably deposited by selective ALD, the ruthenium-containing portion 77 extends only in the horizontal (i.e., parallel to the major surface 7 of the substrate) direction and does not have vertical portions extending up the sidewalls of the insulating spacer 74 past more than two electrically conductive layers 46. Thus, the barrier layer 75 contacts the sidewalls of the insulating spacer 74 in the trench 79.

Figure 12:
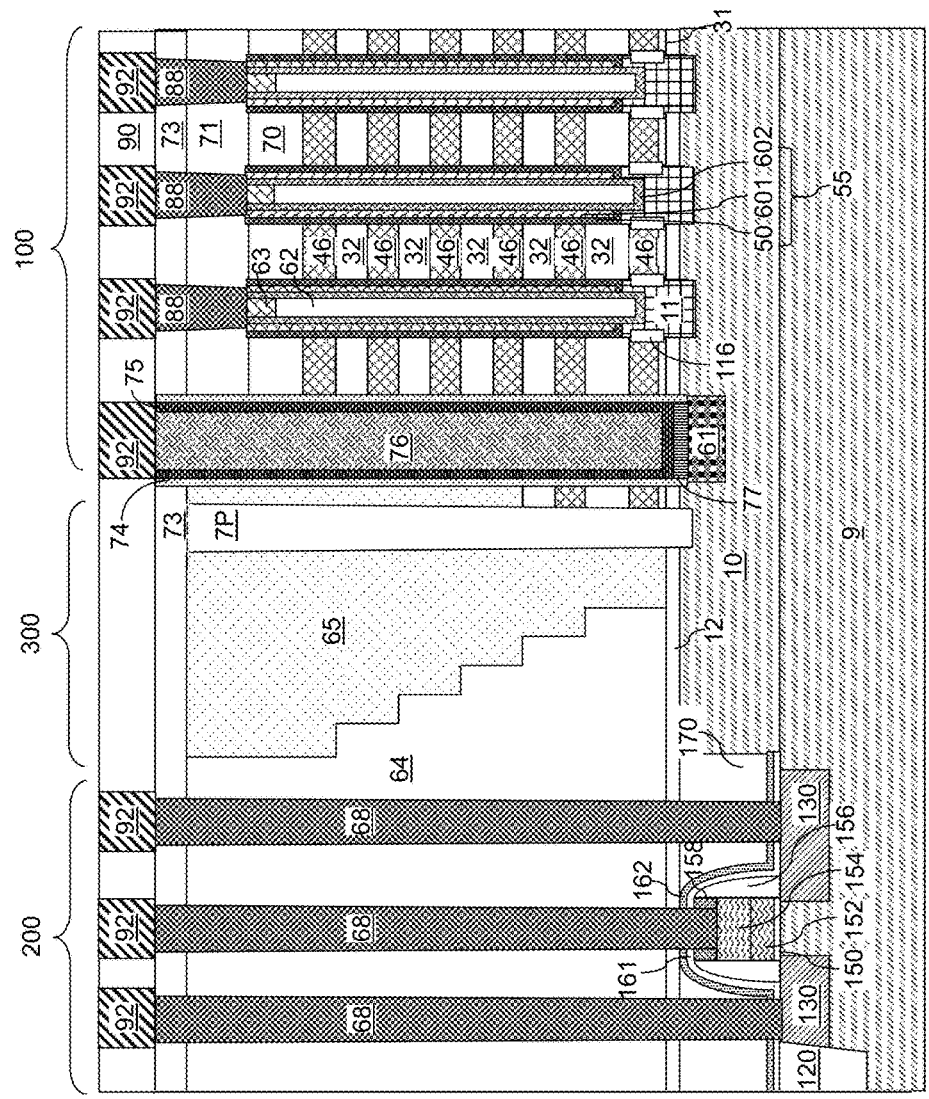
FIG. 12 is a vertical cross-sectional view of the first exemplary structure after formation of additional contact via structures and metal lines according to the first embodiment of the present disclosure.

Referring to FIG. 12, a photoresist layer (not shown) can be applied over the topmost layer of the first exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures (not shown) can be formed on the respective electrically conductive layers 46. Peripheral device contact via structures 68 can be formed on the respective nodes of the peripheral devices. Additional metal interconnect structures including at least one dielectric material layers 90 and metal lines 92 can be formed over the first exemplary structure to provide electrical wiring among the various contact via structures.

The first exemplary structure can include an alternating stack of insulating layers 32 and electrically conductive layers 46 located over a substrate (9, 10); an insulating spacer 74 located at a periphery of a contact trench 79 that extends through the alternating stack (32, 46); and a contact via structure (77, 75, 76) laterally surrounded by the insulating spacer 74. The contact via structure (77, 75, 76) includes a ruthenium-containing portion 77 contacting a top surface of a doped semiconductor portion (such as a source region 61) located in or over (e.g., embedded in) the substrate (9, 10); and at least one conductive material portion (75, 76) overlying the ruthenium-containing portion 77 and located within an inner sidewall of the insulating spacer.

In one embodiment, the at least one conductive material portion (75, 76) can include a metallic diffusion barrier layer 75 contacting a top surface of the ruthenium-containing portion 77 and the inner sidewall of the insulating spacer 74; and a conductive fill material portion 76 surrounded by the metallic diffusion barrier layer 75. In one embodiment, the metallic diffusion barrier layer 75 comprises a material selected from a conductive metallic nitride material and a conductive metallic carbide material; and the conductive fill material portion 76 comprises an elemental metal portion. In one embodiment, the electrically conductive layers 46 comprise a compressive stress-generating material, and the at least one conductive fill material portion 76 comprises a portion including a tensile stress-generating material (such Co or Ru).

In one embodiment, the ruthenium-containing portion 77 can have a uniform thickness throughout, and can consist essentially of elemental ruthenium; and the doped semiconductor portion that is in contact with the contact via structure (77, 75, 76) can be a source region of a three-dimensional memory device. In this case, at least one memory stack structure 55 extending through the alternating stack (32, 46) can be formed. Each of the at least one memory stack structure 55 can comprises, from inside to outside, a semiconductor channel 60; a tunneling dielectric 506 laterally surrounding the semiconductor channel 60; and a vertical stack of charge storage regions (as embodied by discrete portions of the memory material layer 504 located at each level of the electrically conductive layers 46) laterally surrounding the tunneling dielectric 506. Optionally, the memory film 50 may also include a blocking dielectric layer located in the memory opening. Alternatively or in addition, a blocking dielectric layer may be disposed in the backside recesses 43 between the control gate electrodes 46 and layer 504.

In one embodiment, the first exemplary structure can include a three-dimensional memory device that comprises a vertical NAND device formed in a device region 100. The electrically conductive layers 46 can comprise, or can be electrically connected to, a respective word line of the NAND device. The device region 100 can comprise a plurality of semiconductor channels 60. At least one end portion of each of the plurality of semiconductor channels 60 extends substantially perpendicular to a top surface of the substrate (9, 10). The device region 100 can further include a plurality of charge storage regions as embodied as portions of the memory material layer 504. Each charge storage region can be located adjacent to a respective one of the plurality of semiconductor channels 60. A plurality of control gate electrodes (as embodied by portions of the electrically conductive layers 46 that are adjacent to the memory stack structures 55) can have a strip shape extending substantially parallel to the top surface of the substrate (9, 10). The plurality of control gate electrodes can comprise at least a first control gate electrode located in a first device level and a second control gate electrode located in a second device level. The electrically conductive layers 46 in the alternating stack (32, 46) can be in electrical contact with the plurality of control gate electrodes and extend from the device region 100 to a contact region 300 including a plurality of electrically conductive via connections (which are contact via structures that contact the electrically conductive layers 46 in the contact region 300). In one embodiment, the substrate (9, 10) can comprise a silicon substrate containing a driver circuit for the NAND device (which may be provided in the peripheral device region 200).

Figure 13:
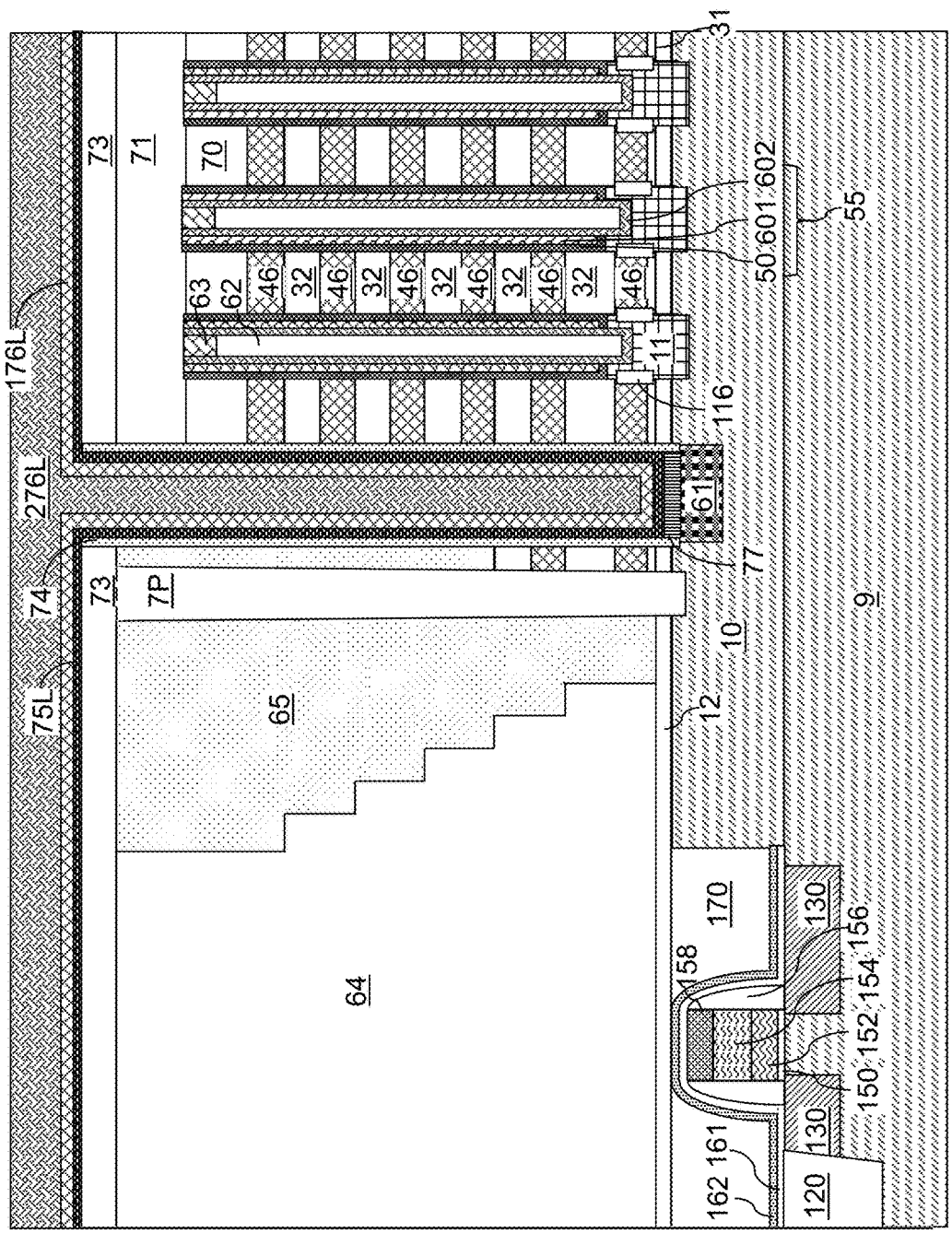
FIG. 13 is a vertical cross-sectional view of an alternate embodiment of the first exemplary structure after deposition of a plurality of conductive material layers according to the first embodiment of the present disclosure.

Referring to FIG. 13, an alternate embodiment of the first exemplary structure can be derived from the first exemplary structure of FIG. 9 by depositing a plurality of conductive material layers in the backside trenches 79. For example, a continuous metallic diffusion barrier layer 75L can be deposited as in the processing steps of FIG. 10. A first conductive fill material layer 176L and a second conductive fill material layer 276L can be sequentially deposited in the remaining cavity within each backside trench 79. Each of the first conductive fill material layer 176L and the second conductive fill material layer 276L can include any of the materials that can be employed for the conductive fill material layer 76L.

In one embodiment, one of the first conductive fill material layer 176L and the second conductive fill material layer 276L can include a compressive stress-generating material, and the other of the first conductive fill material layer 176L and the second conductive fill material layer 276L can include a tensile stress-generating material. For example, the compressive stress-generating material can include W, and the tensile stress-generating material can include Co or Ru.

Figure 14:
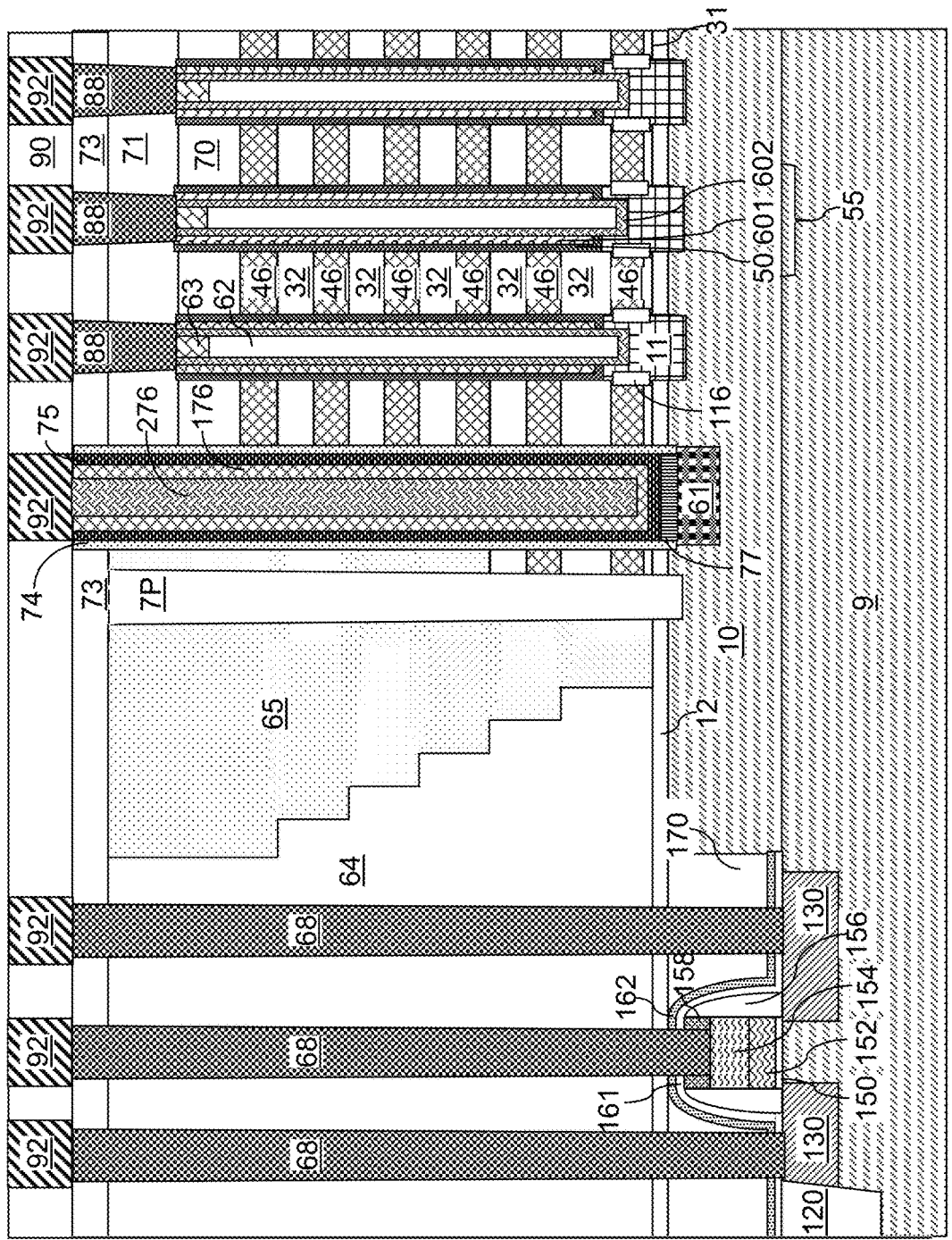
FIG. 14 is a vertical cross-sectional view of the alternate embodiment of the first exemplary structure after formation of contact via structures and metal lines according to the first embodiment of the present disclosure.

Referring to FIG. 14, a planarization process can be performed to remove horizontal portions of the conductive material layers (75L, 176L, 276L) from above a horizontal plane including the top surface of the second contact level dielectric layer 73. Each remaining portion of the continuous metallic diffusion barrier layer 75L constitutes a metallic diffusion barrier layer 75. Each remaining portion of the first conductive fill material layer 176L constitutes a first conductive fill material portion 176. Each remaining portion of the second conductive fill material layer 276L constitutes a second conductive fill material portion 276. Each adjoining set of a ruthenium-containing portion 77, a metallic diffusion barrier layer 75, a first conductive fill material portion 176, and a second conductive fill material portion 276 constitutes a contact via structure (77, 75, 176, 276). In one embodiment, a contact via structure (77, 75, 176, 276) can include a tensile stress-generating material and a conductive material that is different from the tensile stress-generating material, such as a compressive stress-generating material. For example, the first conductive fill material portion 176 can include a tensile stress-generating material, and the second conductive fill material portion 276 can include a compressive stress-generating material. For example, the tensile stress-generating material can include Co or Ru, and the compressive stress-generating material can include W. Additional metal interconnect structures including at least one dielectric material layers 90 and metal lines 92 can be formed over the first exemplary structure to provide electrical wiring among the various contact via structures.

Figure 15:
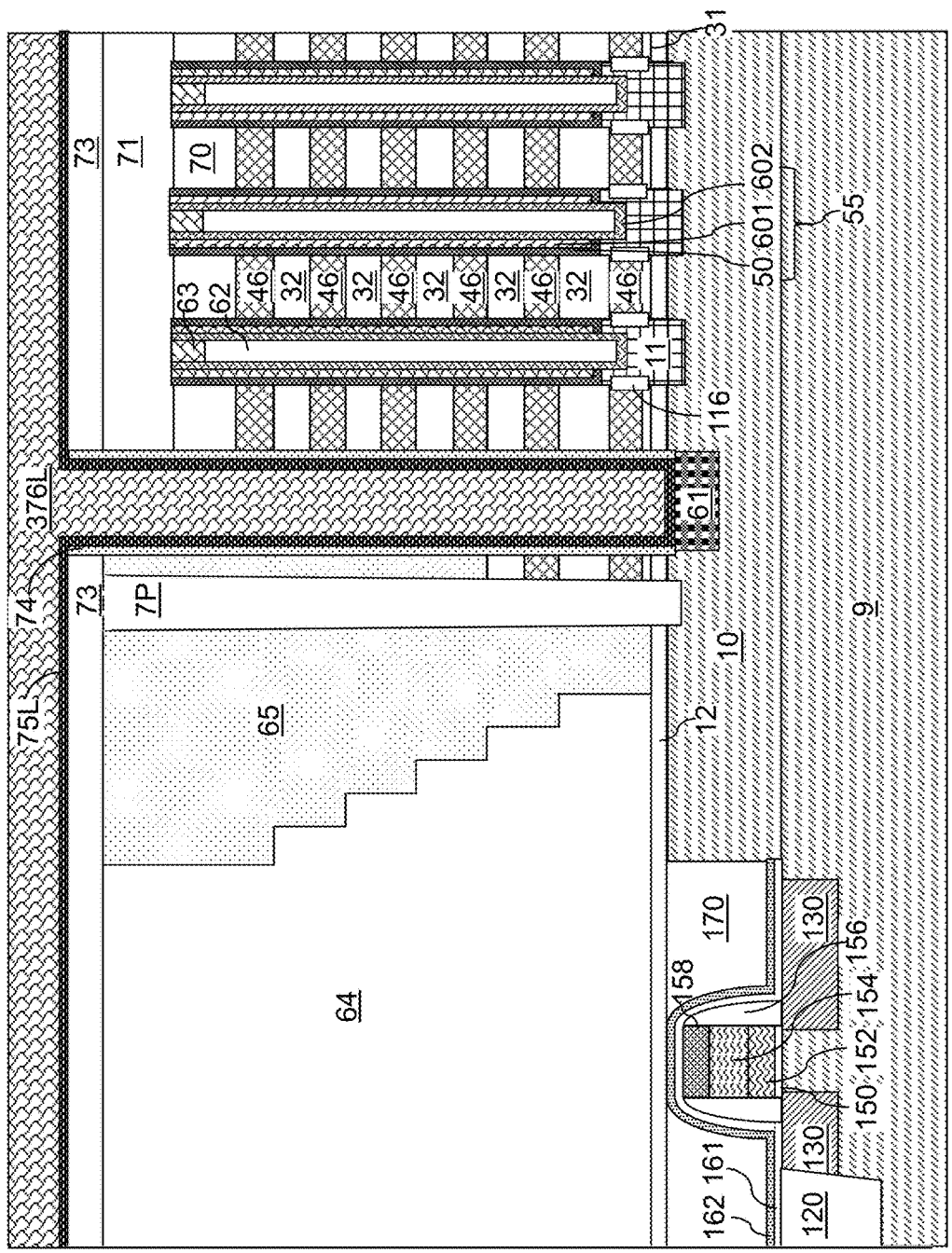
FIG. 15 is a vertical cross-sectional view of a second exemplary structure after formation of a conductive material layer according to a second embodiment of the present disclosure.

Referring to FIG. 15, a second exemplary structure according to a second embodiment of the present disclosure is illustrated, which can be derived from the first exemplary structure of FIG. 8 by omitting a subsequent step of forming ruthenium-containing portions 77 corresponding to the processing steps of FIG. 9, and by forming the metallic diffusion barrier layer 75L employing the processing steps of FIG. 10. In this case, the metallic diffusion barrier layer 75L cab be formed directly on the top surface of each doped semiconductor portion (as embodied as the source regions 61) in or over (e.g., embedded in) the substrate (9, 10) and directly on the inner sidewall of each insulating spacer 74. In this embodiment, the barrier layer 75L may comprise a titanium underlayer which improves contact resistance and a TiN overlayer which functions as a diffusion barrier.

A first conductive fill material layer 376L can be deposited in each cavity in the backside trenches 79 and over the top surface of the contact level dielectric layers (71, 73). Each cavity in the backside trenches 79 is filled by a portion of the first conductive fill material layer 376L. The first conductive fill material layer 376L can be any material that can be employed for the conductive fill material layer 76L, the first conductive fill material layer 176L, or the second conductive fill material layer 276L according to the first embodiment of the present disclosure. In one embodiment, the first conductive fill material layer 376L can include a conductive material that can be employed for the first conductive fill material layer 176L. In one embodiment, the first conductive fill material layer 376L can include a tensile stress-generating material such as Co or Ru. Alternatively, the first conductive fill material layer 376L can include a doped semiconductor material or a compressive stress-generating material such as W, for example fluorine free W.

Figure 16:
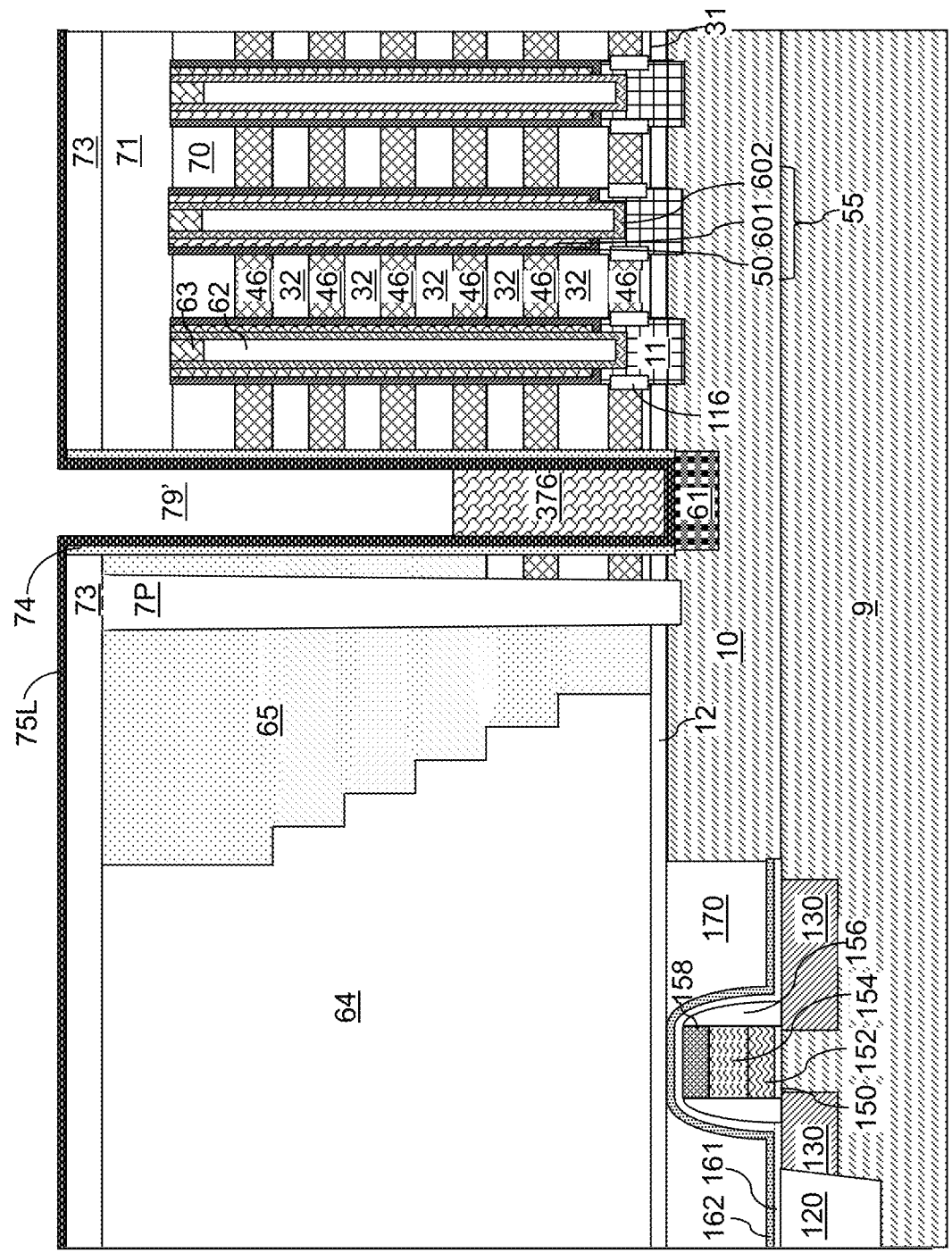
FIG. 16 is a vertical cross-sectional view of the second exemplary structure after formation of a conductive material portion according to the second embodiment of the present disclosure.

Referring to FIG. 16, the first conductive fill material layer 376L can be recessed, for example, by a recess etch process, to remove portion of the first conductive fill material layer 376L from above the contact level dielectric layers (71, 73) and from an upper portion of each backside trench 79. Each remaining portion of the first conductive fill material layer 376L is herein referred to as a first conductive fill material portion 376. The top surface of each first conductive material portion 376 can be located at a height between a first horizontal plane including a bottommost surface of the alternating stack (32, 46) and a second horizontal plane including a topmost surface of the alternating stack (32, 46). In one embodiment, the top surface of each first conductive material portion 376 can be located between 10% and 90% of the height of the backside trenches 79.

Figure 17:
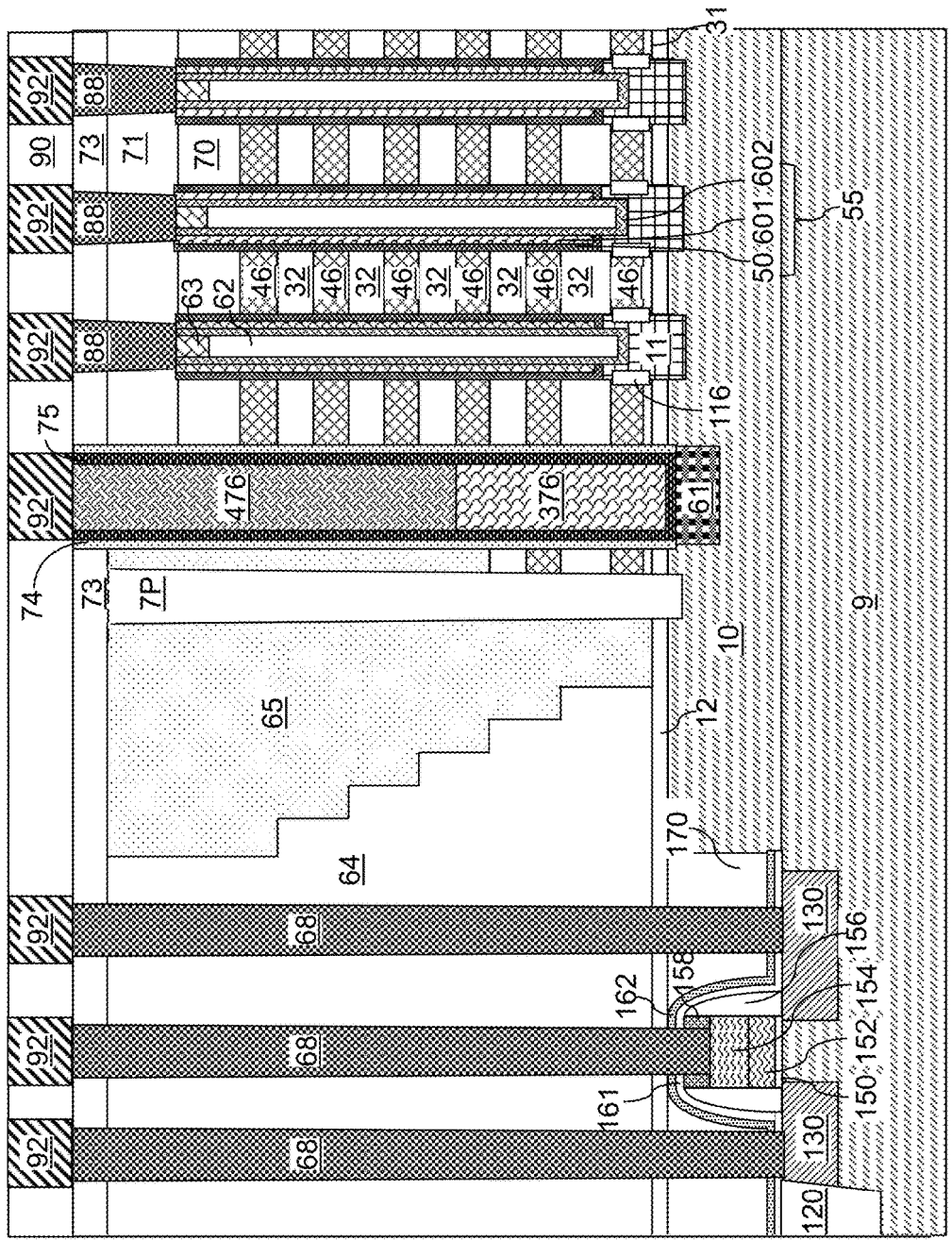
FIG. 17 is a vertical cross-sectional view of the second exemplary structure after a formation of contact via structures and metal lines according to the second embodiment of the present disclosure.

Referring to FIG. 17, a second conductive fill material layer can be deposited in each cavity in the backside trenches 79 and over the top surface of the contact level dielectric layers (71, 73). The second conductive fill material layer includes a conductive material that is different from the material of the first conductive material portion 376, and can be any material that can be employed for the conductive fill material layer 76L, the first conductive fill material layer 176L, or the second conductive fill material layer 276L according to the first embodiment of the present disclosure. In one embodiment, the second conductive fill material layer can include a conductive material that can be employed for the second conductive fill material layer 276L. In one embodiment, the first conductive fill material layer 376L can include a tensile stress-generating material such as Co or Ru, and the second conductive fill material layer can include a compressive stress-generating material such as W. Alternatively, the first conductive fill material layer 376L can include a doped semiconductor material or a compressive stress-generating material such as W, and the second conductive fill material layer can include a tensile stress-generating material such as Co or Ru.

The portion of the second conductive fill material layer overlying the first and second contact level dielectric layers (71, 73) can be planarized to provide a second conductive fill material portion 476 above each first conductive fill material portion 376. The planarization of the second conductive fill material layer can be performed, for example, by chemical mechanical planarization (CMP) or a recess etch. Additional contact via structures (88, 68) can be formed as in the first embodiment. Additional metal interconnect structures including at least one dielectric material layers 90 and metal lines 92 can be formed over the first exemplary structure to provide electrical wiring among the various contact via structures.

In one embodiment, a combination of a tensile stress-generating metal portion (which can be one of the first and second conductive fill material portions (376, 476)) and a conductive material portion (which can be the other of the first and second conductive fill material portions (376, 476)) can be formed on the metallic diffusion barrier layer 75 and in an unfilled volume of the backside trench as provided after deposition of the continuous metallic diffusion barrier layer 75L at a processing step of FIG. 10. A remaining portion of the continuous metallic diffusion barrier layer 75L (which is a metallic diffusion barrier layer 75) and the combination of the first and second conductive fill material portions (376, 476) after the planarization process that removes the horizontal portion of the second conductive fill material layer from above the contact level dielectric layers (71, 73) constitutes a contact via structure (75, 376, 476). Each of the first and second conductive fill material portions (376, 476) can contact an inner sidewall of the metallic diffusion barrier layer 75.

In one embodiment, the first conductive fill material portion 376 can include a tensile stress-generating material, and may be formed by depositing a conductive tensile stress-generating material on the continuous metallic diffusion barrier layer 75L and recessing an upper portion of the deposited conductive tensile stress-generating material. The second conductive material portions 476 can include a compressive stress-generating material or a doped semiconductor material, and can be formed by depositing a compressive stress-generating material or the semiconductor material over each first conductive material portion 376.

Figure 18:
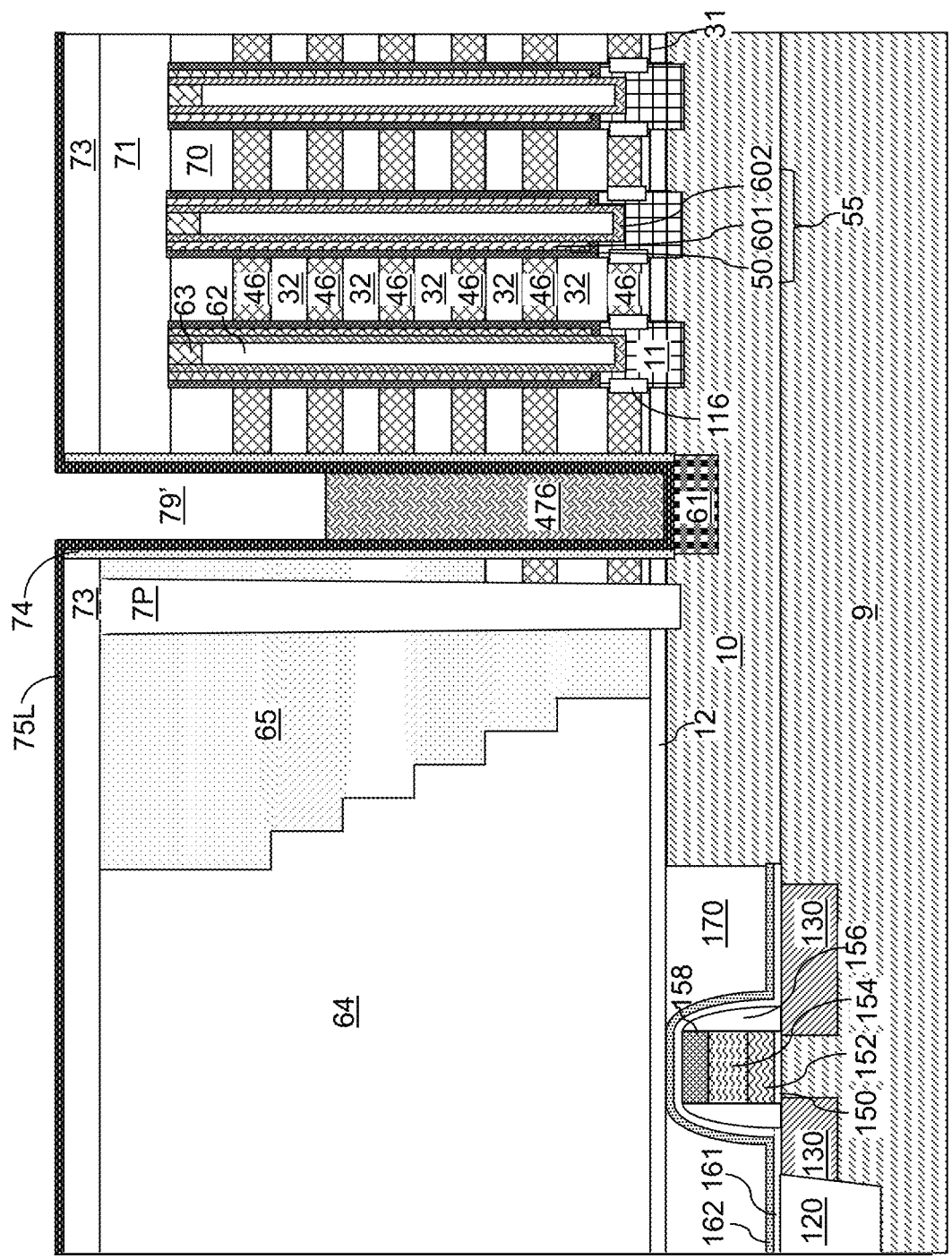
FIG. 18 is a vertical cross-sectional view of a first alternate embodiment of the second exemplary structure after a formation of a tensile stress-generating metal portion according to the second embodiment of the present disclosure.

Referring to FIG. 18, a first alternate embodiment of the second exemplary structure can be derived from the second exemplary structure by exchanging the material of the first conductive fill material layer 376L and the second conductive fill material layer. After formation of the metallic diffusion barrier layer 75L employing the processing steps of FIG. 10, a second conductive fill material layer can be deposited and recessed to form a second conductive fill material portion 476 at a bottom portion of each backside trench 79. The second conductive fill material portion 476 contacts a top surface of a horizontal bottom portion of the metallic diffusion barrier layer 75L and a lower portion of an inner sidewall of the metallic diffusion barrier layer 75L. In one embodiment, the top surface of each second conductive material portion 476 can be located between 10% and 90% of the height of the backside trenches 79.

Figure 19:
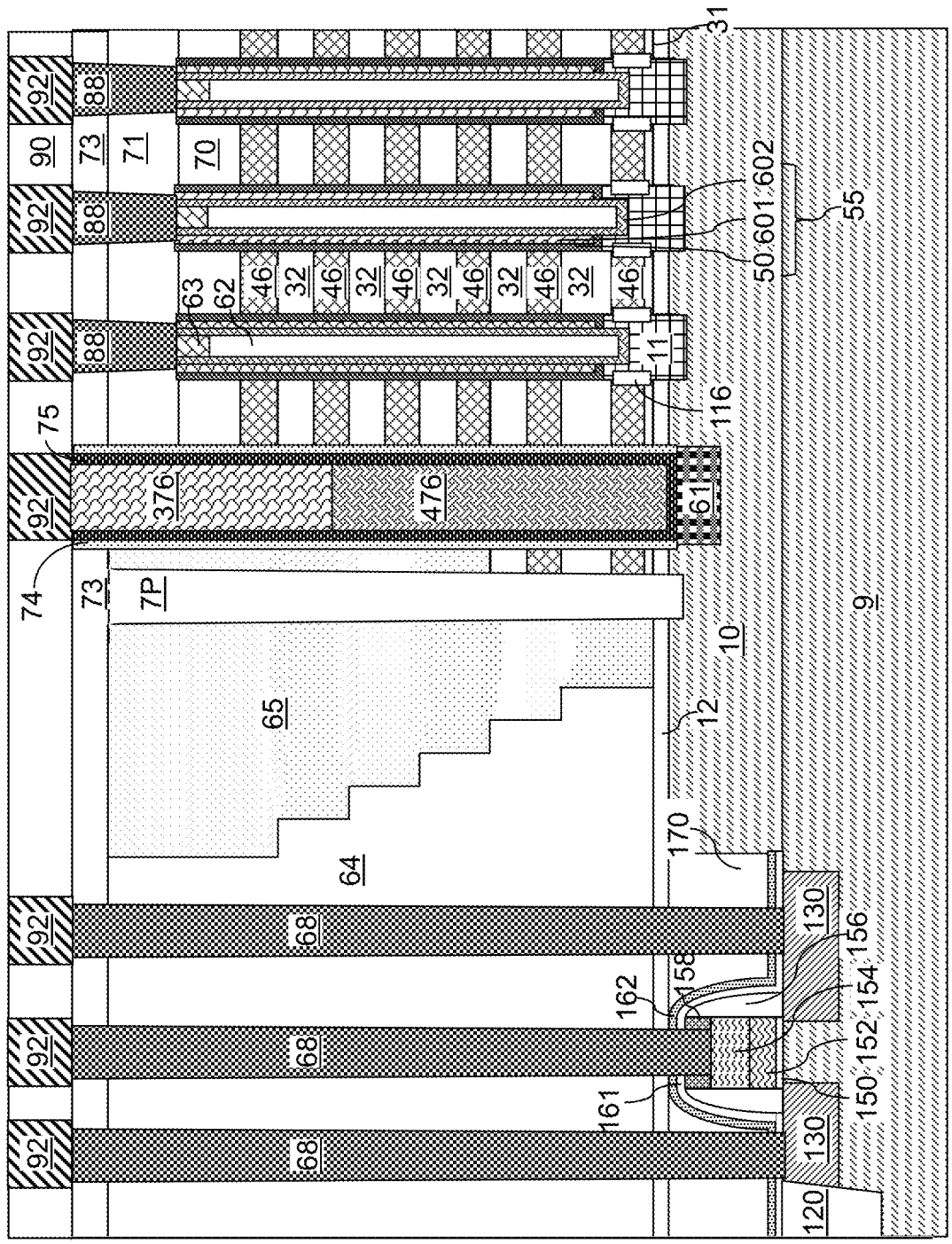
FIG. 19 is a vertical cross-sectional view of the first alternate embodiment of the second exemplary structure after formation of contact via structures and metal lines according to the second embodiment of the present disclosure.

Referring to FIG. 19, a first conductive fill material layer 376L can be deposited in each cavity in the backside trenches 79 and over the top surface of the contact level dielectric layers (71, 73). The first conductive fill material layer includes a conductive material that is different from the material of the second conductive material portion 476, and can be any material that can be employed for the conductive fill material layer 76L, the first conductive fill material layer 176L, or the second conductive fill material layer 276L according to the first embodiment of the present disclosure. The portion of the first conductive fill material layer overlying the first and second contact level dielectric layers (71, 73) can be planarized to provide a first conductive fill material portion 376 above each second conductive fill material portion 476. The planarization of the first conductive fill material layer can be performed, for example, by chemical mechanical planarization (CMP) or a recess etch.

In one embodiment, the first conductive fill material layer 376L can include a conductive material that can be employed for the first conductive fill material layer 176L. In one embodiment, second conductive fill material portions 476 can include a tensile stress-generating material such as Co or Ru, and the first conductive fill material portions 376 can include a compressive stress-generating material such as W. Alternatively, the second conductive fill material portions 476 can include a doped semiconductor material or a compressive stress-generating material such as W, and the first conductive fill material portions 376 can include a tensile stress-generating material such as Co or Ru.

In one embodiment, a combination of a tensile stress-generating metal portion (which can be one of the first and second conductive fill material portions (376, 476)) and a conductive material portion (which can be the other of the first and second conductive fill material portions (376, 476)) can be formed on the metallic diffusion barrier layer 75 and in an unfilled volume of the backside trench as provided after deposition of the continuous metallic diffusion barrier layer 75L at a processing step of FIG. 10. A remaining portion of the continuous metallic diffusion barrier layer 75L (which is a metallic diffusion barrier layer 75) and the combination of the first and second conductive fill material portions (376, 476) after the planarization process that removes the horizontal portion of the second conductive fill material layer from above the contact level dielectric layers (71, 73) constitutes a contact via structure (75, 376, 476). Each of the first and second conductive fill material portions (376, 476) can contact an inner sidewall of the metallic diffusion barrier layer 75.

In one embodiment, the second conductive fill material portion 476 can include a compressive stress-generating material or a doped semiconductor material, and may be formed by depositing a conductive compressive stress-generating material or the semiconductor material on the continuous metallic diffusion barrier layer 75L and recessing an upper portion of the deposited compressive tensile stress-generating material. The first conductive material portions 376 can include a tensile stress-generating material, and can be formed by depositing a tensile stress-generating material over each second conductive material portion 476.

Figure 20:
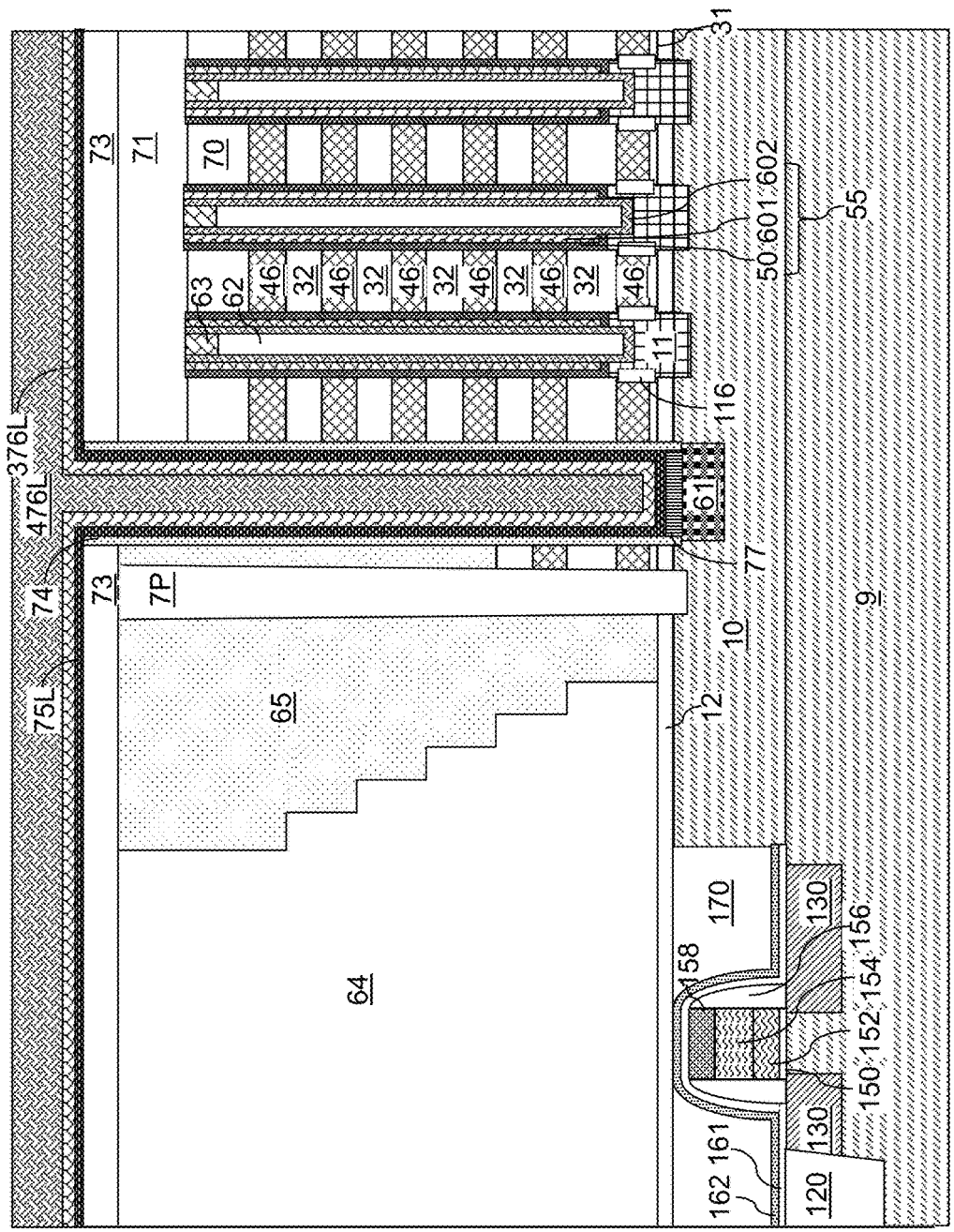
FIG. 20 is a vertical cross-sectional view of a second alternate embodiment of the second exemplary structure after a formation of a tensile stress-generating metal layer and a conductive material layer according to the second embodiment of the present disclosure.

Referring to FIG. 20, a second alternate embodiment of the second exemplary structure can be derived from the second exemplary structure by selecting the thickness of the first conductive fill material layer 376L at the processing step of FIG. 15 to be less than one half of the smallest lateral distance between a pair of opposing inner sidewalls of the continuous metallic diffusion barrier layer 75L. Subsequently, a second conductive fill material layer 476L is deposited to fill remaining cavities within the backside trenches.

Figure 21:
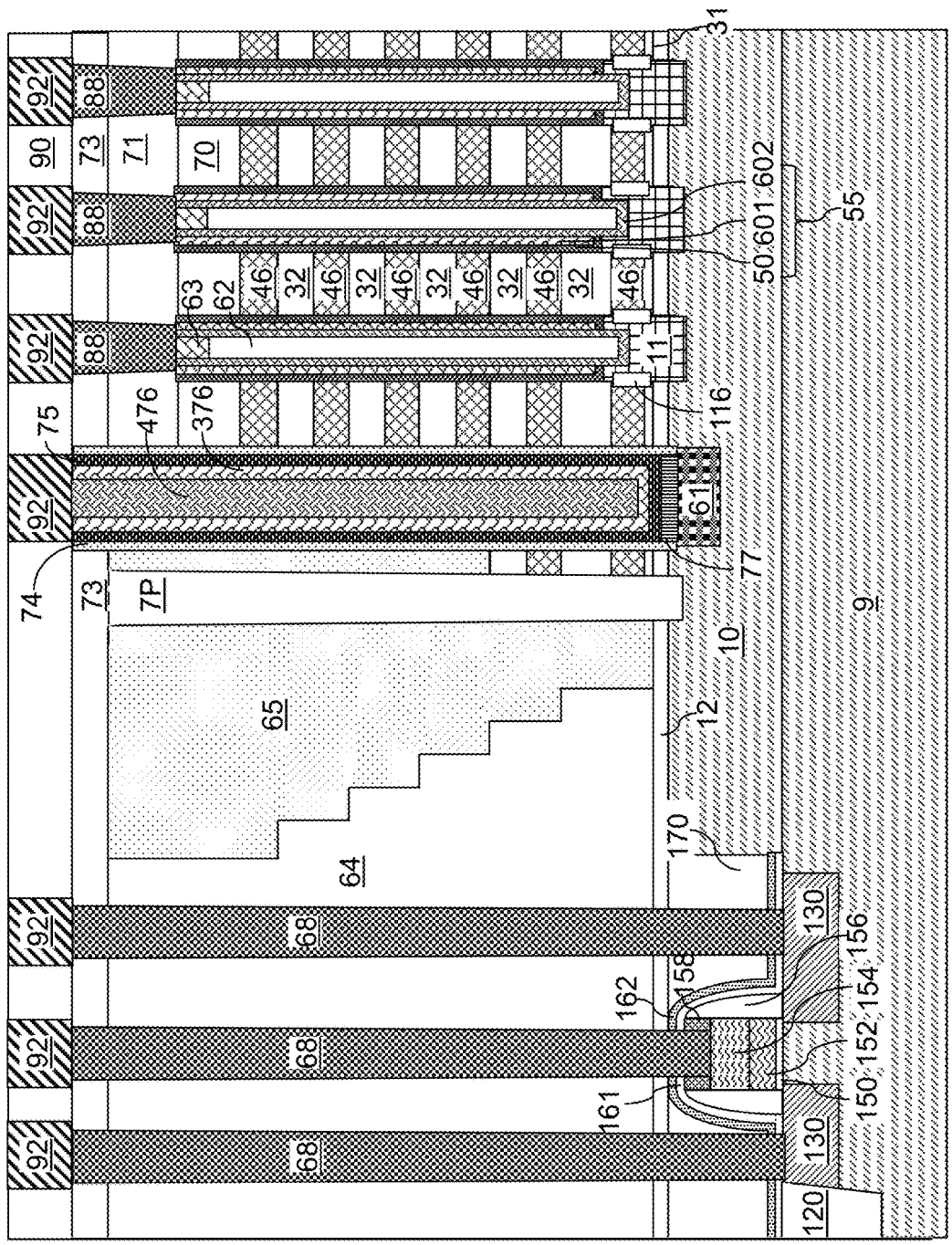
FIG. 21 is a vertical cross-sectional view of the second alternate embodiment of the second exemplary structure after formation of contact via structures and metal lines according to the second embodiment of the present disclosure.

Referring to FIG. 21, a planarization process can be performed to remove portions of the first and second conductive fill material layers (376L, 476L) from above the contact level dielectric layers (71, 73). Additional contact via structures (88, 68) can be formed as needed. Additional metal interconnect structures including at least one dielectric material layers 90 and metal lines 92 can be formed over the first exemplary structure to provide electrical wiring among the various contact via structures.

In one embodiment, a combination of a tensile stress-generating metal portion (which can be one of the first and second conductive fill material portions (376, 476)) and a conductive material portion (which can be the other of the first and second conductive fill material portions (376, 476)) can be formed on the metallic diffusion barrier layer 75 and in an unfilled volume of the backside trench as provided after deposition of the continuous metallic diffusion barrier layer 75L at a processing step of FIG. 10. A remaining portion of the continuous metallic diffusion barrier layer 75L (which is a metallic diffusion barrier layer 75) and the combination of the first and second conductive fill material portions (376, 476) after the planarization process that removes the horizontal portion of the second conductive fill material layer from above the contact level dielectric layers (71, 73) constitutes a contact via structure (75, 376, 476). The first conductive fill material portion 376 can contact an inner sidewall of the metallic diffusion barrier layer 75. The second conductive fill material portion 476 can be spaced from the metallic diffusion barrier layer 75 by the first conductive fill material portion 376.

In one embodiment, the first conductive fill material portion 376 can include a tensile stress-generating material, and may be formed by depositing a conductive tensile stress-generating material on the continuous metallic diffusion barrier layer 75L and recessing an upper portion of the deposited conductive tensile stress-generating material. The second conductive material portions 476 can include a compressive stress-generating material or a doped semiconductor material, and can be formed by depositing a compressive stress-generating material or the semiconductor material over each first conductive material portion 376.

Figure 22:
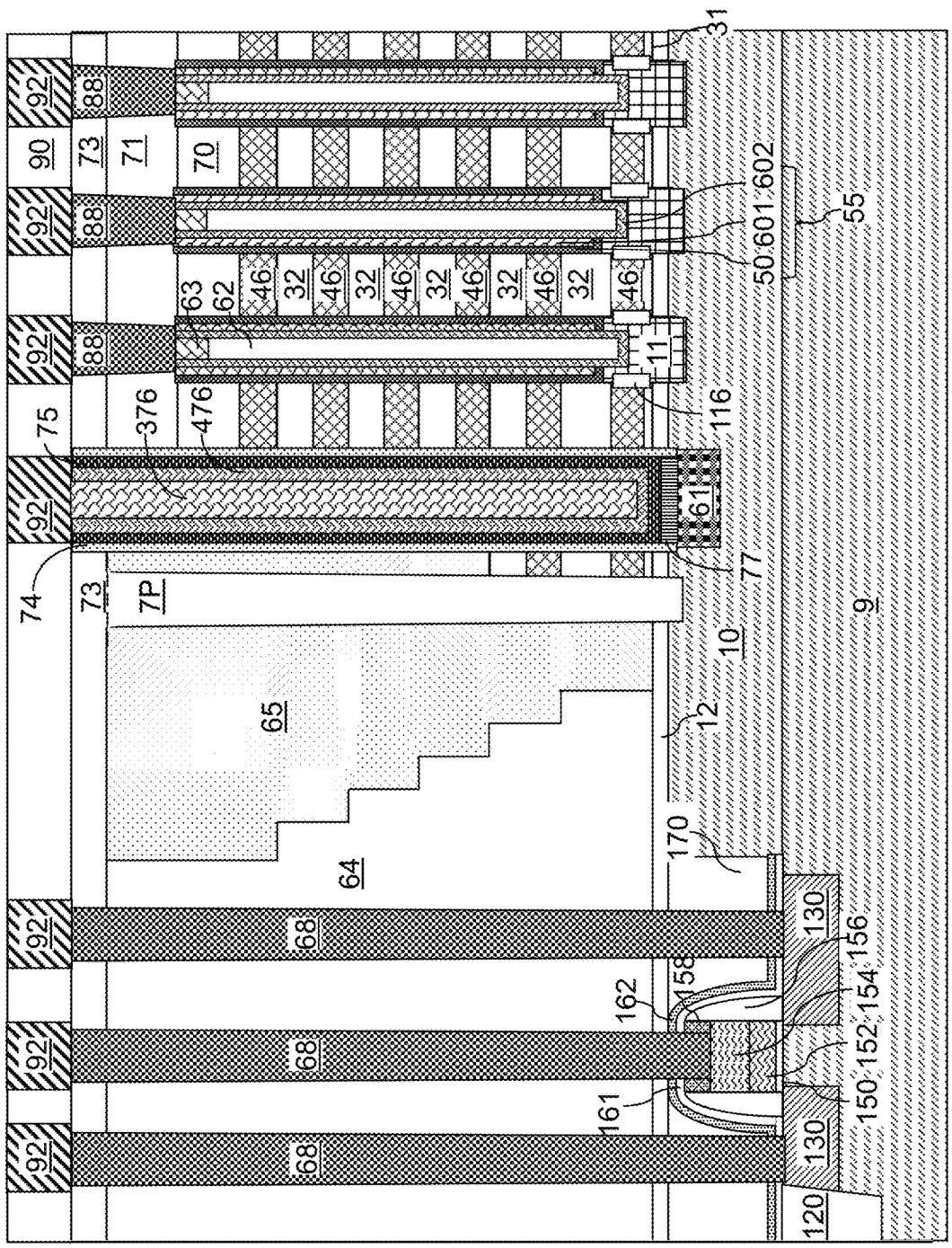
FIG. 22 is a vertical cross-sectional view of a third alternate embodiment of the second exemplary structure after formation of contact via structures and metal lines according to the second embodiment of the present disclosure.

Referring to FIG. 22, a third alternate embodiment of the second exemplary structure can be derived from first alternate embodiment of the second exemplary structure by selecting the thickness of the second conductive fill material layer 476L at the processing step of FIG. 18 to be less than one half of the smallest lateral distance between a pair of opposing inner sidewalls of the continuous metallic diffusion barrier layer 75L. Subsequently, a first conductive fill material layer 376L is deposited to fill remaining cavities within the backside trenches. In other words, the positions of the first and second conductive fill material layers (376L, 476L) are exchanged with respect to the second alternate embodiment of the second exemplary structure illustrated in FIG. 20.

A planarization process can be performed to remove portions of the first and second conductive fill material layers (376L, 476L) from above the contact level dielectric layers (71, 73). Additional contact via structures (88, 68) can be formed as needed. Additional metal interconnect structures including at least one dielectric material layers 90 and metal lines 92 can be formed over the first exemplary structure to provide electrical wiring among the various contact via structures.

In one embodiment, a combination of a tensile stress-generating metal portion (which can be one of the first and second conductive fill material portions (376, 476)) and a conductive material portion (which can be the other of the first and second conductive fill material portions (376, 476))

can be formed on the metallic diffusion barrier layer 75 and in an unfilled volume of the backside trench as provided after deposition of the continuous metallic diffusion barrier layer 75L at a processing step of FIG. 10. A remaining portion of the continuous metallic diffusion barrier layer 75L (which is a metallic diffusion barrier layer 75) and the combination of the first and second conductive fill material portions (376, 476) after the planarization process that removes the horizontal portion of the second conductive fill material layer from above the contact level dielectric layers (71, 73) constitutes a contact via structure (75, 376, 476). The second conductive fill material portion 476 can contact an inner sidewall of the metallic diffusion barrier layer 75. The first conductive fill material portion 376 can be spaced from the metallic diffusion barrier layer 75 by the second conductive fill material portion 476.

In one embodiment, the second conductive fill material portion 476 can include a compressive stress-generating material or a doped semiconductor material, and may be formed by depositing a conductive compressive stress-generating material or the semiconductor material on the continuous metallic diffusion barrier layer 75L and recessing an upper portion of the deposited compressive tensile stress-generating material. The first conductive material portions 376 can include a tensile stress-generating material, and can be formed by depositing a tensile stress-generating material over each second conductive material portion 476.

The various embodiments of the second exemplary structure includes an alternating stack of insulating layers 32 and electrically conductive layers 46 located over a substrate (9, 10); an insulating spacer located at a periphery of a contact trench that extends through the alternating stack (9, 10); and a contact via structure (75, 376, 476) laterally surrounded by the insulating spacer 74. The contact via structure (75, 376, 476) can include a metallic diffusion barrier layer 75 contacting a top surface of a doped semiconductor portion (such as a source region 61) in or over (e.g., embedded in) the substrate (9, 10) and contacting the inner sidewall of the insulating spacer 74; a tensile stress-generating metal portion (one of 376 and 476) surrounded by the metallic diffusion barrier layer 75; and a conductive material portion (the other of 376 and 476) contacting the tensile stress-generating metal portion and surrounded by the metallic diffusion barrier layer 75.

In one embodiment, the metallic diffusion barrier layer 75 comprises a material selected from one or more of a conductive metallic nitride material, such as TiN, and a conductive refractor metal, such as Ti, and the tensile stress-generating material portion can comprise cobalt. In one embodiment, the conductive material portion can contact a lower portion of an inner sidewall of the metallic diffusion barrier layer 75, and the tensile stress-generating metal portion can contact an upper portion of the inner sidewall of the metallic diffusion barrier layer 75. Alternatively, the conductive material portion can contact an inner sidewall of the metallic diffusion barrier layer 75, and the tensile stress-generating metal portion can be surrounded by the conductive material portion, and can be spaced from the metallic diffusion barrier layer 75 by the conductive material portion.

In one embodiment, the tensile stress-generating metal portion can comprise cobalt, and the conductive material portion can comprise tungsten. Alternatively or additionally, the tensile stress-generating metal portion can comprise cobalt, and the conductive material portion comprises a doped semiconductor material such as p-doped polysilicon or n-doped polysilicon.

At least one memory stack structure 55 can be provided through the alternating stack (32, 46). Each of the at least one memory stack structure 55 can comprises, from inside to outside, a semiconductor channel 60; a tunneling dielectric 506 laterally surrounding the semiconductor channel 60; and a vertical stack of charge storage regions (as embodied by discrete portions of the memory material layer 504 located at each level of the electrically conductive layers 46) laterally surrounding the tunneling dielectric 506.

In one embodiment, the second exemplary structure can include a three-dimensional memory device that comprises a vertical NAND device formed in a device region 100. The electrically conductive layers 46 can comprise, or can be electrically connected to, a respective word line of the NAND device. The device region 100 can comprise a plurality of semiconductor channels 60. At least one end portion of each of the plurality of semiconductor channels 60 extends substantially perpendicular to a top surface of the substrate (9, 10). The device region 100 can further include a plurality of charge storage regions as embodied as portions of the memory material layer 504. Each charge storage region can be located adjacent to a respective one of the plurality of semiconductor channels 60. A plurality of control gate electrodes (as embodied by portions of the electrically conductive layers 46 that are adjacent to the memory stack structures 55) can have a strip shape extending substantially parallel to the top surface of the substrate (9, 10). The plurality of control gate electrodes can comprise at least a first control gate electrode located in a first device level and a second control gate electrode located in a second device level. The electrically conductive layers 46 in the alternating stack (32, 46) can be in electrical contact with the plurality of control gate electrodes and extend from the device region 100 to a contact region 300 including a plurality of electrically conductive via connections (which are contact via structures that contact the electrically conductive layers 46 in the contact region 300). In one embodiment, the substrate (9, 10) can comprise a silicon substrate containing a driver circuit for the NAND device (which may be provided in the peripheral device region 200).

The various embodiments of the present disclosure can be employed to provide lower contact resistance and/or reduced stress in, and around, a contact via structure extending though an alternating stack of insulator layers and electrically conductive layers and contacting an electrical node in a substrate, which can be a source region of one or more vertical NAND strings. If a ruthenium-containing portion is employed, the ruthenium-containing portion provides low contact resistance while functioning as a diffusion barrier layer. Use of conductive materials generating opposite types of stress in the electrically conductive layers 46 and in the contact via structures can reduce warping of the substrate and overall stress and in the device structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
an alternating stack of insulating layers and electrically conductive layers located over a substrate;
an insulating spacer located at a periphery of a contact trench that extends through the alternating stack; and
a contact via structure laterally surrounded by the insulating spacer and comprising:
a ruthenium-containing portion contacting a top surface of a doped semiconductor portion located in or over the substrate; and
at least one conductive material portion overlying the ruthenium-containing portion and located within an inner sidewall of the insulating spacer.

2. The structure of claim 1, wherein the at least one conductive material portion comprises:
a metallic diffusion barrier layer contacting a top surface of the ruthenium-containing portion and the inner sidewall of the insulating spacer; and
a conductive fill material portion surrounded by the metallic diffusion barrier layer.

3. The structure of claim 2, wherein:
the metallic diffusion barrier layer comprises a material selected from a conductive metallic nitride material and a conductive metallic carbide material;
the electrically conductive layers comprise a compressive stress-generating material; and
the conductive fill material portion comprises a tensile stress-generating metal.

4. The structure of claim 2, wherein:
the metallic diffusion barrier layer comprises a conductive metallic nitride material;
the electrically conductive layers comprise tungsten; and
the conductive fill material portion comprises cobalt.

5. The structure of claim 3, wherein the at least one conductive material portion comprises another portion including a metallic material different from the tensile stress-generating material.

6. The structure of claim 1, wherein:
the ruthenium-containing portion has a uniform thickness throughout, and consists essentially of elemental ruthenium; and
the doped semiconductor portion is a source region of a three-dimensional memory device.

7. The structure of claim 1, further comprising at least one memory stack structure extending through the alternating stack, wherein each of the at least one memory stack structure comprises, from inside to outside:
a semiconductor channel;
a tunneling dielectric laterally surrounding the semiconductor channel; and
charge storage regions laterally surrounding the tunneling dielectric layer, and wherein:
the structure comprises a three-dimensional memory device that comprises a vertical NAND device formed in a device region;
the electrically conductive layers comprise, or are electrically connected to, a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the alternating stack are in electrical contact with the plurality of control gate electrodes and extend from the device region to a contact region including a plurality of electrically conductive via connections; and
the substrate comprises a silicon substrate containing a driver circuit for the NAND device.

8. A method of manufacturing a structure, comprising:
forming an alternating stack comprising insulating layers and electrically conductive layers over a substrate having a trench extending through the alternating stack;
forming an insulating spacer on a sidewall of the trench;
forming a ruthenium-containing portion on a top surface of a doped semiconductor portion located in or over the substrate and underlying the trench;
forming at least one conductive material portion on the ruthenium-containing portion within an unfilled volume of the trench, wherein a combination of the ruthenium-containing portion and the at least one conductive material portion constitutes a contact via structure.

9. The method of claim 8, wherein:
the ruthenium-containing portion is formed by selective deposition of ruthenium on the doped semiconductor surface while ruthenium is not deposited on the insulating spacer; and
the at least one conductive material portion is formed directly on an inner sidewall of the insulating spacer.

10. The method of claim 8, wherein the at least one conductive material portion is formed by:
forming a metallic diffusion barrier layer on a top surface of the ruthenium-containing portion and on an inner sidewall of the insulating spacer by depositing a material selected from a conductive metallic nitride material and a conductive metallic carbide material; and
forming a conductive fill material portion by depositing cobalt or fluorine free tungsten inside the metallic diffusion barrier layer.

11. The method of claim 10, wherein:
the electrically conductive layers are formed by depositing a compressive stress-generating material; and
the conductive fill material portion is formed by depositing a tensile stress-generating material.

12. The method of claim 11, wherein:
the electrically conductive layers are formed by depositing tungsten; and
the conductive fill material portion is formed by depositing cobalt.

13. The structure of claim 8, further comprising forming at least one memory stack structure extending through the alternating stack, wherein each of the at least one memory stack structure comprises, from inside to outside:
a semiconductor channel;
a tunneling dielectric laterally surrounding the semiconductor channel; and
charge storage regions laterally surrounding the tunneling dielectric layer, and wherein:

the structure comprises a three-dimensional memory device that comprises a vertical NAND device formed in a device region;

the electrically conductive layers comprise, or are electrically connected to, a respective word line of the NAND device;

the device region comprises:
- a plurality of semiconductor channels, wherein at least one end portion of each of the plurality of semiconductor channels extends substantially perpendicular to a top surface of the substrate;
- a plurality of charge storage regions, each charge storage region located adjacent to a respective one of the plurality of semiconductor channels; and
- a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the alternating stack are in electrical contact with the plurality of control gate electrodes and extend from the device region to a contact region including a plurality of electrically conductive via connections; and the substrate comprises a silicon substrate containing a driver circuit for the NAND device.

* * * * *